US006919601B2

(12) United States Patent
Inaba

(10) Patent No.: US 6,919,601 B2
(45) Date of Patent: Jul. 19, 2005

(54) SEMICONDUCTOR DEVICE WITH GATE ELECTRODE FORMED ON EACH OF THREE SIDE SURFACES OF AN ACTIVE LAYER, AND MANUFACTURING METHOD THEREOF

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/703,004

(22) Filed: Nov. 5, 2003

(65) Prior Publication Data

US 2005/0051843 A1 Mar. 10, 2005

(30) Foreign Application Priority Data

Sep. 8, 2003 (JP) ........................................ 2003-315874

(51) Int. Cl.[7] ................................................. H01L 27/01
(52) U.S. Cl. ........................ 257/347; 438/149; 438/157
(58) Field of Search ................................. 257/402, 407, 257/412, 413, 347, 352, 353, 354; 438/149, 151, 156, 157, 479

(56) References Cited

U.S. PATENT DOCUMENTS

| 6,525,403 B2 | 2/2003 | Inaba et al. |
| 2004/0075122 A1 * | 4/2004 | Lin et al. |

FOREIGN PATENT DOCUMENTS

JP  2-263473  10/1990

OTHER PUBLICATIONS

R. Chau et al., "Advanced Depleted–Substrate Transistors: Single–gate, Doubled–gate and Tri–gate," 2002 International Conference on Solid State Devices and Materials (SSDM), D–1–1, 2002, pp. 68–69.

X. Huang et al., "Sub 50–nm FinFET: PMOS," International Electron Devices Meeting (IEDM) Tech. Digest, 1999, pp. 67–70.

D. Hisamoto et al., "A Folded–channel MOSFET for Deep–sub–tenth Micron Era," International Electron Devices Meeting, 1998, pp. 1032–1034.

J. Hergenrother et al, International Electron Devices Meeting, 1999, p. 75.

* cited by examiner

Primary Examiner—Nathan J. Flynn
Assistant Examiner—Kevin Quinto
(74) Attorney, Agent, or Firm—Frommer Lawrence & Haug LLP

(57) ABSTRACT

A semiconductor device includes an active layer having a first side surface, a second side surface perpendicular to the first side surface and a third side surface opposite to the second side surface, a first gate electrode arranged on the first side surface with a first gate insulating film disposed therebetween, a second gate electrode formed of a material different from that of the first gate electrode and arranged on the second side surface with a second gate insulating film disposed therebetween, and a third gate electrode formed of a material different from that of the first gate electrode and arranged on the third side surface with a third gate insulating film disposed therebetween.

42 Claims, 15 Drawing Sheets

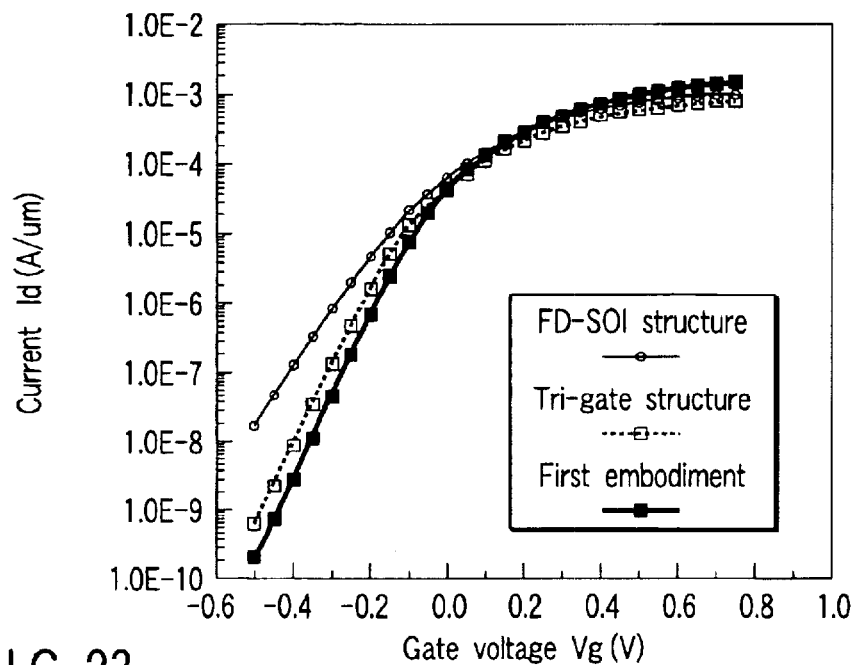
F I G. 23
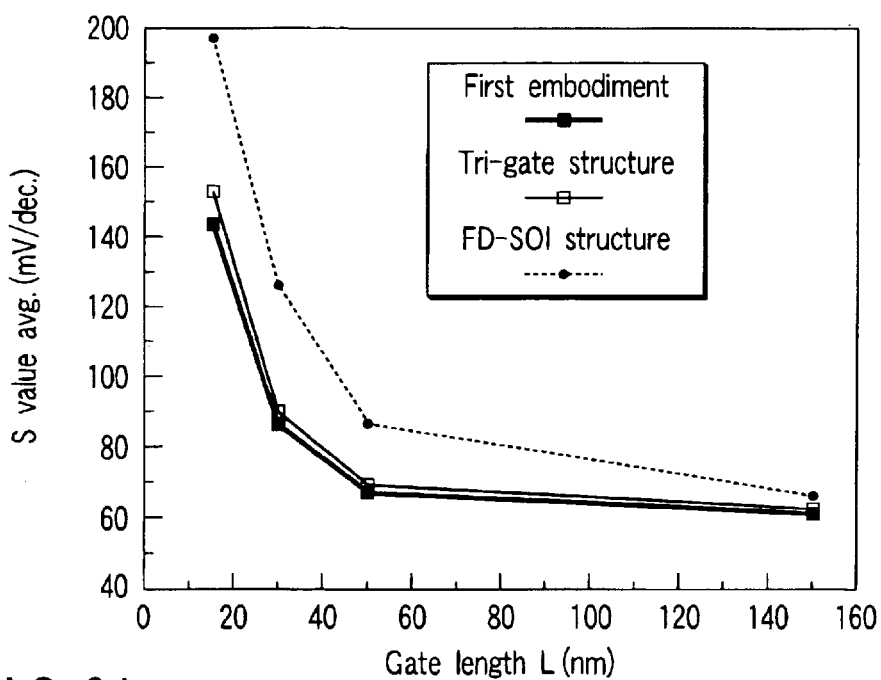
F I G. 24

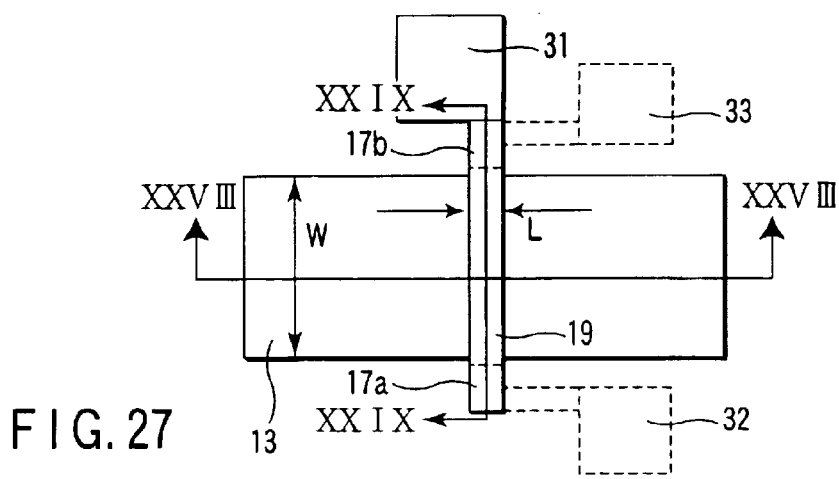
FIG. 27
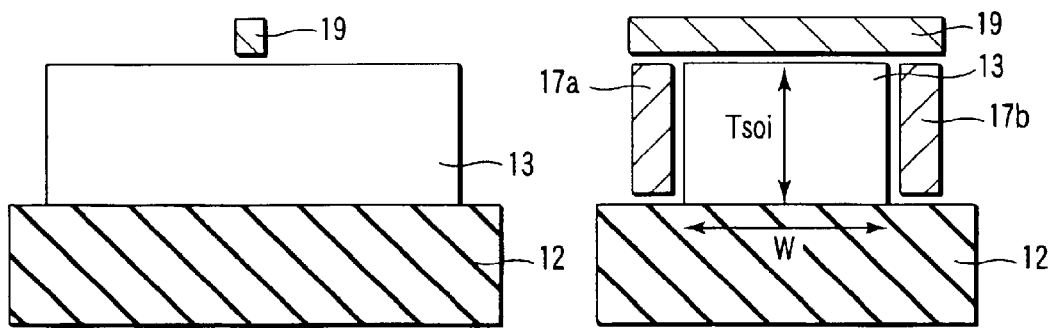
FIG. 28
FIG. 29
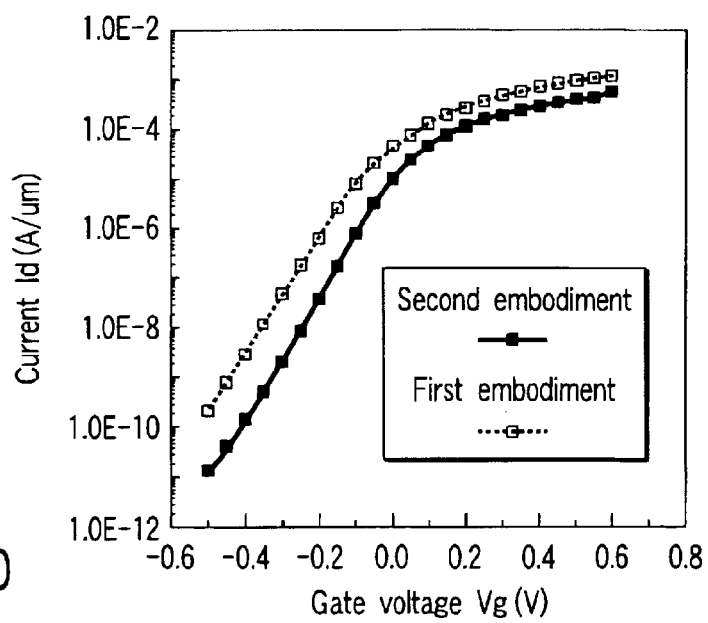
FIG. 30

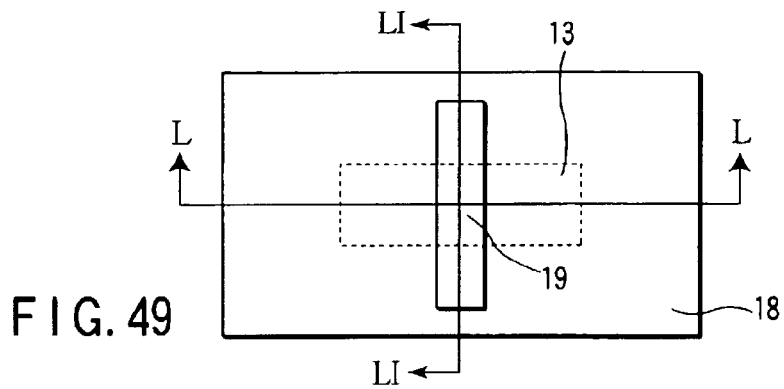
F I G. 49
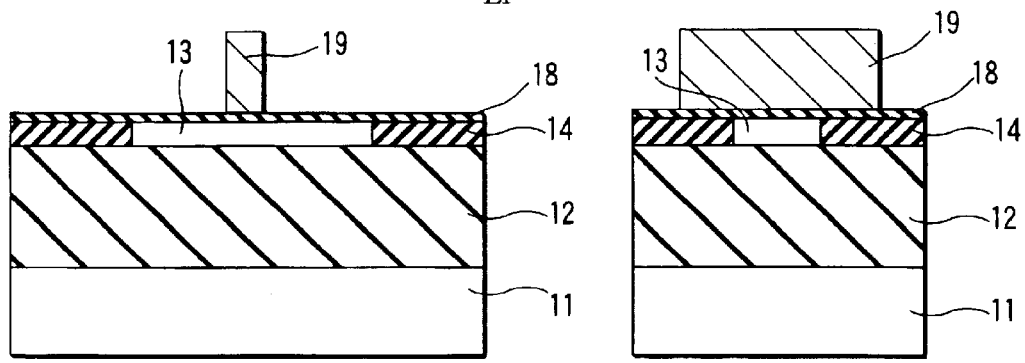
F I G. 50
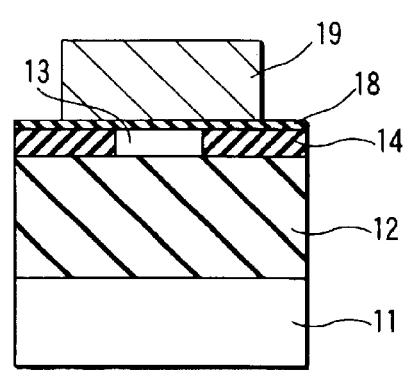
F I G. 51
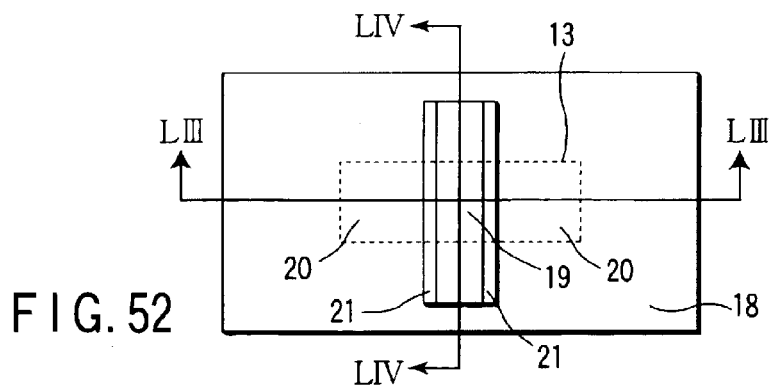
F I G. 52
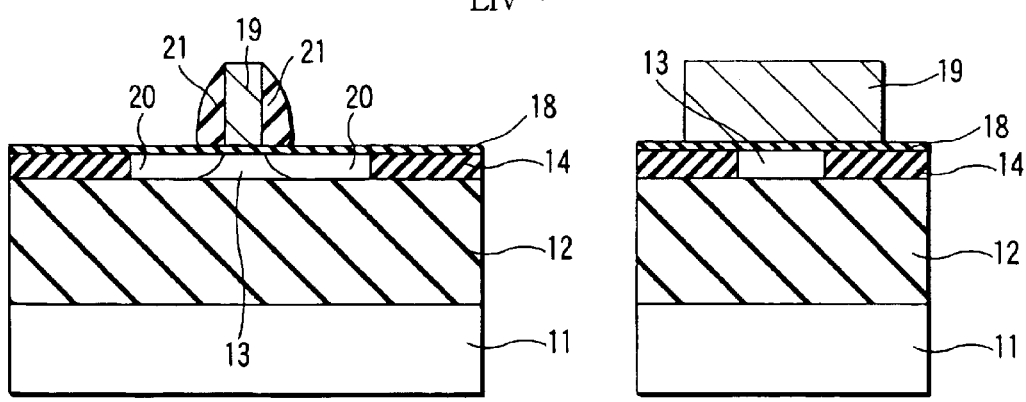
F I G. 53
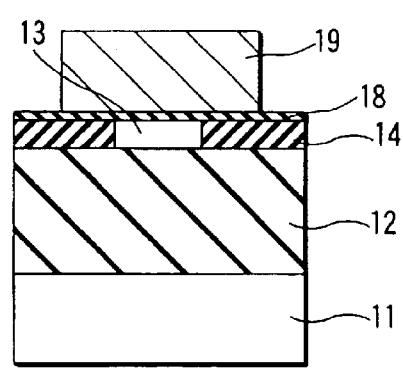
F I G. 54

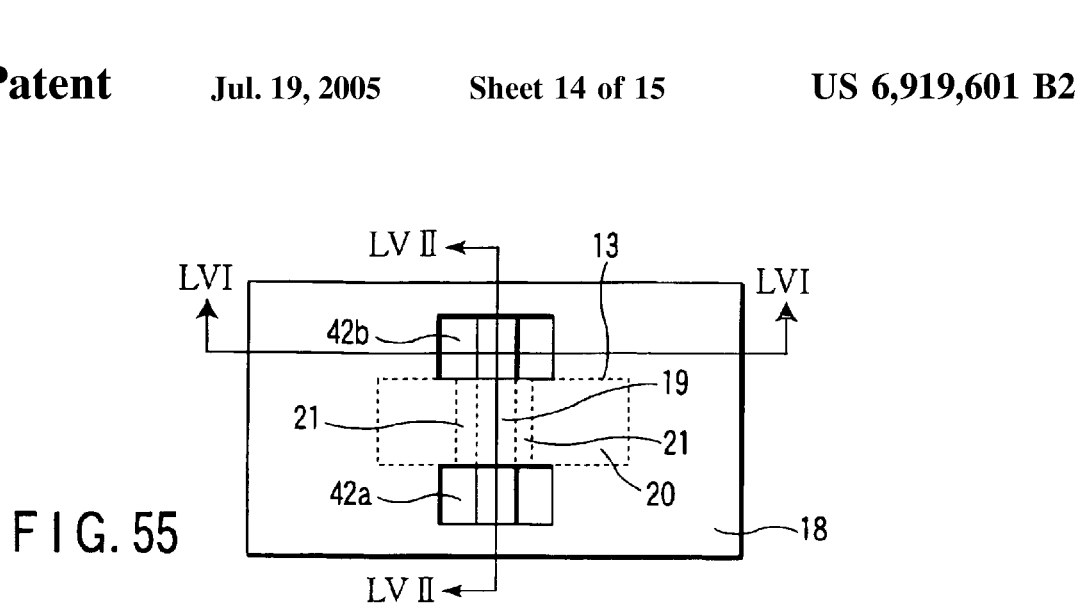
F I G. 55
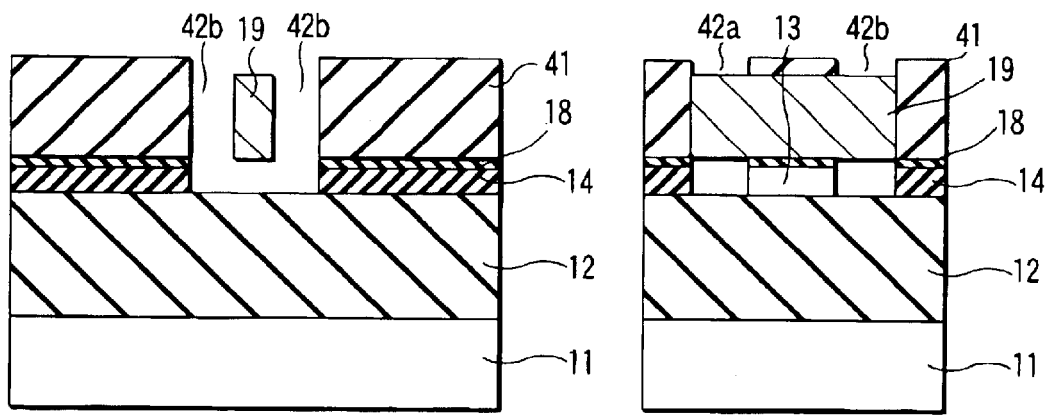
F I G. 56    F I G. 57
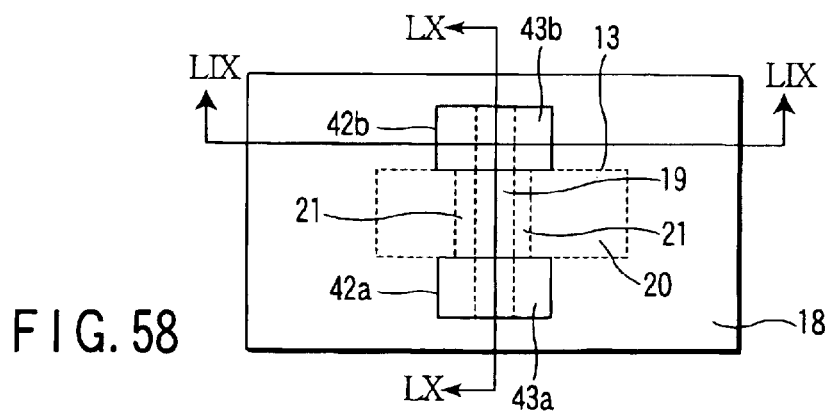
F I G. 58

SEMICONDUCTOR DEVICE WITH GATE ELECTRODE FORMED ON EACH OF THREE SIDE SURFACES OF AN ACTIVE LAYER, AND MANUFACTURING METHOD THEREOF

CROSS-REFERENCE TO RELATED APPLICATIONS

This application is based upon and claims the benefit of priority from the prior Japanese Patent Application No. 2003-315874, filed Sep. 8, 2003, the entire contents of which are incorporated herein by reference.

BACKGROUND OF THE INVENTION

1. Field of the Invention

This invention relates to a semiconductor device having fully depleted MOSFETs formed on an SOI substrate or bulk substrate to configure a CMOS circuit of high operation speed and low power consumption in a semiconductor integrated circuit device and a manufacturing method of the same.

2. Description of the Related Art

In the present system LSI, MOSFETs configuring the system LSI are miniaturized to further enhance the performance thereof. In this type of device, the reliability of the device is degraded if the power supply voltage is not lowered. At the same time, however, if the power supply voltage is lowered, the current drive is lowered. Therefore, in order to adequately maintain the current drive, it is necessary to lower the threshold voltage (Vt) with a lowering in the power supply voltage.

Generally, if the threshold voltage is lowered, an off leakage current will increase and the short channel effect caused by a reduction in the gate length also occurs. Therefore, the power consumption in the standby state of the whole chip becomes higher and this develops into a serious problem.

Thus, when the device size is miniaturized, it is necessary to maintain the cutoff characteristic of the current characteristic of the MOSFET in a good condition.

The cutoff characteristic in the Id-Vg characteristic of the MOSFET is characterized by an inclination of the Id-Vg characteristic curve of the sub threshold region and is expressed by an S value (sub threshold swing S: S-factor) as shown in the following equation (1).

$$S=[d(\log_{10} Id)/dVg]^{-1} \quad (1)$$

The S value of the equation (1) indicates gate voltage required to lower the drain current value by one order. In the MOSFET using a typical bulk substrate, the S value is approximately 70 to 100 mV/dec.

It is understood that the equation (1) can be expressed by the following equation (2) based on the analytic equation of the drain current Id in the sub threshold region of the ideal MOSFET.

$$S=(K_B T/q)(\log_e 10)[1+Cdm/Cox] \quad (2)$$

where $K_B$ indicates Boltzmann's constant, T indicates absolute temperature, q indicates an element charge, Cdm ($=\text{sqrt}(\epsilon_{si} q Na/4 \phi_B)$) indicates depletion capacitance in the substrate and Cox indicates capacitance of the gate oxide film, respectively.

It is known that the depletion layer particularly on the drain region side extends when the gate length is miniaturized, the potential in a portion near the channel of the MOSFET is deviated from the ideal potential (DIBL: Drain Induced Barrier Lowering) and the S value becomes larger.

That is, it is desirable at present and in future to realize a device structure in which the S value can be kept small even if the gate length is reduced.

Further, if the S value is kept small, the roll-off of the threshold voltage Vt (=the relation between Vt and the gate length) in the so-called short-channel effect is suppressed, which is favorable.

An FD (Fully Depleted) type MOSFET, whose channel region is fully depleted, is conventionally proposed as the MOSFET structure having a small value of Cdm. As a variation of the FD type MOSFET, various types of MOSFETs, such as a planar type single gate SOI structure (FD-SOIMOSFET), planar type double gate structure, fin type double gate structure (refer to a Patent Document 1, Non-Patent Documents 1, 2), vertical structure (refer to Non-Patent Document 3) and tri-gate structure (refer to Non-Patent Document 4) are already provided.

The FD type MOSFETs have both merits and demerits, but it intuitively seems that the double gate structure (planar type, fin type) and tri-gate structure are advantageous by taking it into consideration that the cutoff characteristic is better than the conventional single gate structure.

However, in the planar type among the double gate structure, it is difficult to arrange gate electrodes in the upper and lower positions in a self-aligned manner and there occurs a problem that the manufacturing method becomes complicated. On the other hand, in the fin type among the double gate structure, it is relatively easy to form the double gate structure, but there occurs a problem that the fin width must be made extremely small. Further, since a substrate is cut out in a fin form by use of an RIE (Reactive Ion Etching) process and the side surface portion thereof is used as a channel, it is difficult to use the substrate surface having a plane orientation of <100> used in the planar type. In this case, there occurs a possibility that the interface state density becomes high, thus a problem that the reliability may be lowered occurs.

Further, as shown in FIG. 62, the tri-gate structure is a device in which both of the side surface and upper surface of an SOI layer 113 are used as a channel in an SOI substrate having a supporting substrate 111, buried oxide film (BOX: Buried Oxide) 112 and SOI (Silicon On Insulator) layer 113. The source and drain regions lie on the front side and opposite side of the drawing sheet. The device is controlled by use of gate electric fields in three directions to suppress the punch through between the source and drain regions and enhance the current driving ability. However, like the fin type double gate structure, the tri-gate structure has a problem that the characteristic of a transistor formed on the side surface may not be good. Further, since an electric field caused by a gate electrode 114 is concentrated on corner portions 115 between the upper surface and the side surfaces, parasitic transistors having low threshold voltages are formed only in the corner portions 115. As a result, there occurs a possibility that the cutoff characteristic of the transistor on the channel upper surface portion used as a main transistor will be degraded due to a difference between the characteristic of the transistor on the corner portion 115 and the current characteristic of the transistor on the channel upper surface portion.

[Patent Document 1]

Jpn. Pat. Appln. KOKAI Publication No. 2-263473 (Patent Registration No. 2768719)

[Non-Patent Document 1]

D. Hisamoto et al., "International Electron Devices Meeting (IEDM) '98", p. 1032

[Non-Patent Document 2]

X. Huang et al., "IEDM '99", 1999, p. 67

[Non-Patent Document 3]

J. Hergenrother et al., "IEDM '99", 1999, p. 75

[Non-Patent Document 4]

R. Chau et al., "International Conference of Solid State Devices and Materials (SSDM) 2002", 2002, p. 68

As described above, in the conventional various FD type MOSFETs, it is difficult to attain a favorable cutoff characteristic without making thin a silicon layer used as a channel in a region in which the channel length is short.

BRIEF SUMMARY OF THE INVENTION

A semiconductor device according to a first aspect of the invention comprises an active layer having a first side surface, a second side surface perpendicular to the first side surface and a third side surface opposite to the second side surface, a first gate electrode arranged on the first side surface with a first gate insulating film disposed therebetween, a second gate electrode formed of a material different from that of the first gate electrode and arranged on the second side surface with a second gate insulating film disposed therebetween, and a third gate electrode formed of a material different from that of the first gate electrode and arranged on the third side surface with a third gate insulating film disposed therebetween.

A manufacturing method of a semiconductor device according to a second aspect of the invention comprises forming an active layer having a first side surface, a second side surface perpendicular to the first side surface and a third side surface opposite to the second side surface, and forming a first gate electrode on the first side surface with a first gate insulating film disposed therebetween, forming a second gate electrode on the second side surface with a second gate insulating film disposed therebetween by use of a material different from that of the first gate electrode, and forming a third gate electrode on the third side surface with a third gate insulating film disposed therebetween by use of a material different from that of the first gate electrode.

BRIEF DESCRIPTION OF THE SEVERAL VIEWS OF THE DRAWING

FIG. 23 is a comparison diagram of the Id-Vg characteristics of the separate gate structure, FD-SOI structure and tri-gate structure in the first embodiment of this invention;

FIG. 24 is a comparison diagram of the L-S value characteristics of the separate gate structure, FD-SOI structure and tri-gate structure in the first embodiment of this invention;

FIG. 27 is a plan view showing the semiconductor device according to the second embodiment of this invention;

FIG. 28 is a cross sectional view showing the semiconductor device taken along the XXVIII—XXVIII line of FIG. 27;

FIG. 29 is a cross sectional view showing the semiconductor device taken along the XXIX—XXIX line of FIG. 27;

FIG. 30 is a comparison diagram of the Id-Vg characteristics of the separate gate structure in the second embodiment of this invention and the separate gate structure in the first embodiment of this invention;

FIG. 49 is a plan view showing a manufacturing step of the semiconductor device according to the fifth embodiment of this invention which follows the manufacturing step of FIG. 46;

FIG. 50 is a cross sectional view showing the semiconductor device taken along the L—L line of FIG. 49;

FIG. 51 is a cross sectional view showing the semiconductor device taken along the LI—LI line of FIG. 49;

FIG. 52 is a plan view showing a manufacturing step of the semiconductor device according to the fifth embodiment of this invention which follows the manufacturing step of FIG. 49;

FIG. 53 is a cross sectional view showing the semiconductor device taken along the LIII—LIII line of FIG. 52;

FIG. 54 is a cross sectional view showing the semiconductor device taken along the LIV—LIV line of FIG. 52;

FIG. 55 is a plan view showing a manufacturing step of the semiconductor device according to the fifth embodiment of this invention which follows the manufacturing step of FIG. 52;

FIG. 56 is a cross sectional view showing the semiconductor device taken along the LVI—LVI line of FIG. 55;

FIG. 57 is a cross sectional view showing the semiconductor device taken along the LVII—LVII line of FIG. 55;

FIG. 58 is a plan view showing a manufacturing step of the semiconductor device according to the fifth embodiment of this invention which follows the manufacturing step of FIG. 55;

DETAILED DESCRIPTION OF THE INVENTION

Figure 1:
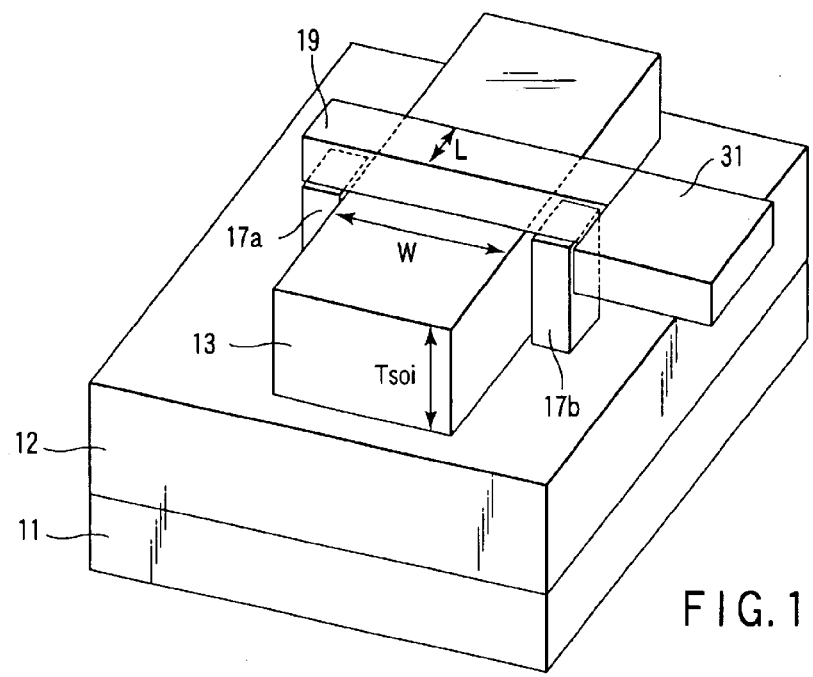
FIG. 1 is a perspective view showing a semiconductor device according to a first embodiment of this invention.
Figure 2:
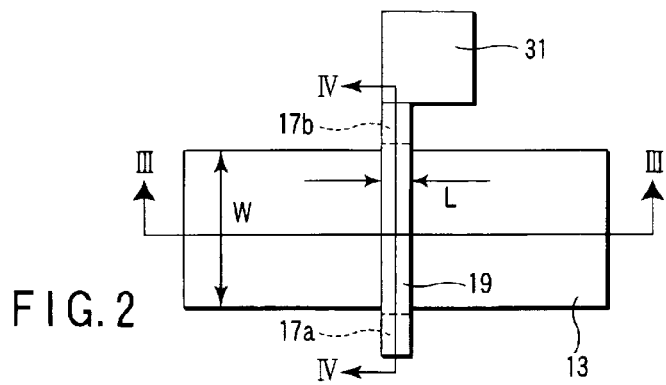
FIG. 2 is a plan view showing the semiconductor device according to the first embodiment of this invention.
Figure 3:
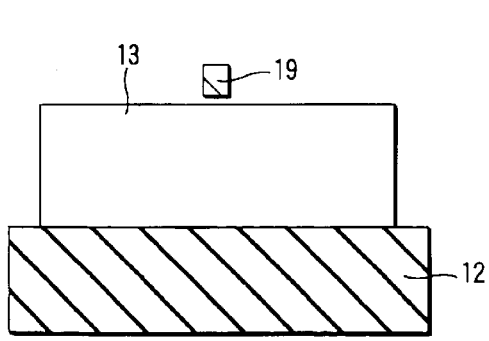
FIG. 3 is a cross sectional view showing the semiconductor device taken along the III—III line of FIG. 2.
Figure 4:
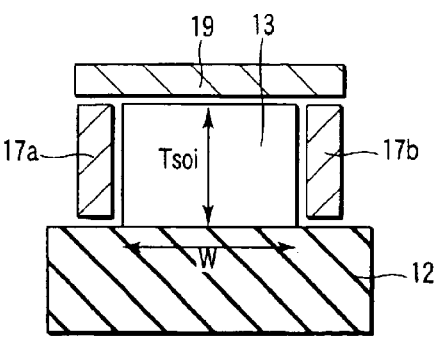
FIG. 4 is a cross sectional view showing the semiconductor device taken along the IV—IV line of FIG. 2.

There will now be described embodiments of this invention with reference to the accompanying drawings. In explaining the embodiments, common reference symbols are attached to like portions throughout all the drawings.

[First Embodiment]

A first embodiment is a basic example of a separate gate structure which is attained by improving the conventional tri-gate structure. In the first embodiment, an upper surface gate electrode lying on the upper surface portion of an SOI (Silicon On Insulator) layer and side surface gate electrodes lying on the side surface portions of the SOI layer are formed of different materials.

FIGS. 1 to 4 are a perspective view, plan view and cross sectional views of a semiconductor device according to the first embodiment of this invention. The semiconductor device according to the first embodiment is explained below.

As shown in FIGS. 1 to 4, an SOI substrate having a supporting substrate 11, buried oxide film (BOX: Buried Oxide) 12 and SOI layer 13 is used. A MOSFET having an upper surface gate electrode 19 disposed on the upper surface portion of the SOI layer 13 and side surface gate electrodes 17a, 17b disposed on the side surface portions of the SOI layer 13 is formed.

In this case, the upper surface gate electrode 19 and the side surface gate electrodes 17a, 17b are formed of different materials. For example, the upper surface gate electrode 19 and the side surface gate electrodes 17a, 17b are formed of the following materials When the MOSFET is of an n-type, the upper surface gate electrode 19 may be formed of a material of $n^+$-type polysilicon and the side surface gate electrodes 17a, 17b may be formed of a material of refractory metal or silicide (for example, W, TiN, Ni) of the refractory metal. Further, when the MOSFET is of an n-type, the upper surface gate electrode 19 can be formed of a material of $n^+$-type polysilicon and the side surface gate electrodes 17a, 17b can be formed of a material of $p^+$-type polysilicon.

When the MOSFET is of a p-type, the upper surface gate electrode 19 may be formed of a material of $p^+$-type polysilicon and the side surface gate electrodes 17a, 17b may be formed of a material of refractory metal or silicide (for example, W, TiN, Ni) of the refractory metal. Further, when the MOSFET is of a p-type, the upper surface gate electrode 19 can be formed of a material of p⁺-type polysilicon and the side surface gate electrodes 17a, 17b can be formed of a material of n⁺-type polysilicon.

When the gate electrodes 17a, 17b, 19 are formed of a metal-series material, it is easy to configure a CMOS if a metal-series material (for example, refractory metal or silicide of the refractory metal) having a work function which is approximately equal to that of the mid gap of silicon is used.

Further, the work function φm1 of the upper surface gate electrode 19 and the work functions φm2, φm3 of the side surface gate electrodes 17a, 17b are different. For example, when the MOSFET is of an n-type, the following expression (3) is satisfied and when the MOSFET is of a p-type, the following expression (4) is satisfied.

$$\phi m1 < \phi m2 \text{ and } \phi m1 < \phi m3 \quad (3)$$

$$\phi m1 > \phi m2 \text{ and } \phi m1 > \phi m3 \quad (4)$$

That is, when the MOSFET is of an n-type, a material having a work function larger than that of the upper surface gate electrode 19 is used for the side surface gate electrodes 17a, 17b so as not to form a channel of a parasitic transistor in the side surface portion of the SOI layer 13. On the other hand, when the MOSFET is of a p-type, a material having a work function smaller than that of the upper surface gate electrode 19 is used for the side surface gate electrodes 17a, 17b so as not to form a channel of a parasitic transistor in the side surface portion of the SOI layer 13. For example, in the case of an n-type MOSFET, it is preferable that n⁺-type polysilicon ($\phi m \approx 4.1$ eV) be used as a material of the upper surface gate electrode 19 and W ($\phi m \approx 4.6$ eV) be used as a material of the side surface gate electrodes 17a, 17b. Further, in the case of a p-type MOSFET, it is preferable that p⁺-type polysilicon ($\phi m \approx 5.2$ eV) be used as a material of the upper surface gate electrode 19 and W be used as a material of the side surface gate electrodes 17a, 17b.

When the expressions (3), (4) are satisfied, the work functions φm2, φm3 may be different, but they are preferably set equal to each other. Therefore, it is desirable to form the side surface gate electrodes 17a, 17b by use of the same material than by use of different materials.

Further, in the MOSFET of the first embodiment, a portion lying under the upper surface gate electrode 19 functions as a channel, and therefore, a drain current flows in the short side direction (channel length L direction) of the upper surface gate electrode 19.

No channel is formed in the side surface portions of the SOI layer 13 which face the side surface gate electrodes 17a, 17b. Therefore, the degree of freedom for selection of the heights of the side surface gate electrodes 17a, 17b is relatively high. Thus, the upper surface of the side surface gate electrodes 17a, 17b may be set equal in height to the upper surface of the SOI layer 13. Alternatively, it may be higher or lower than the upper surface of the SOI layer 13 and can be formed in contact with the upper surface gate electrode 19.

If the channel width is W, gate voltage applied to the side surface gate electrode 17a or 17b is Vgsg and the width of a depletion layer formed by the side surface gate electrode 17a or 17b when Vgsg is set at 0 V is Wd, the following expression (5) is satisfied.

$$W < 2Wd \quad (5)$$

Since the potential profile control by the side surface gate electrode 17a, 17b has a limitation, it is necessary to impose some limitation on the channel width W. Therefore, the relation expressed by the expression (5) is derived to maintain the good cutoff characteristic when Vgsg is set at 0 V, for example.

FIGS. 5 to 22 are plan views and cross sectional views showing a manufacturing process of the semiconductor device according to the first embodiment of this invention. The manufacturing method of the semiconductor device according to the first embodiment is explained below.

Figure 5:
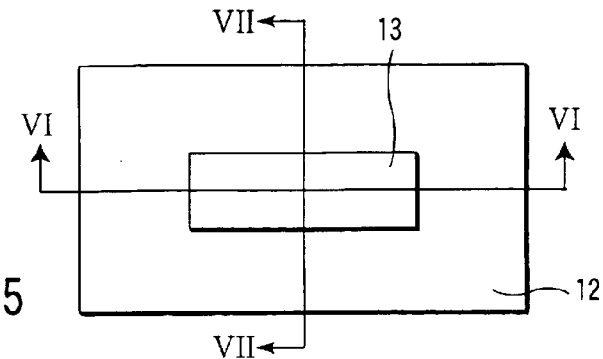
FIG. 5 is a plan view showing a manufacturing step of the semiconductor device according to the first embodiment of this invention.
Figure 6:
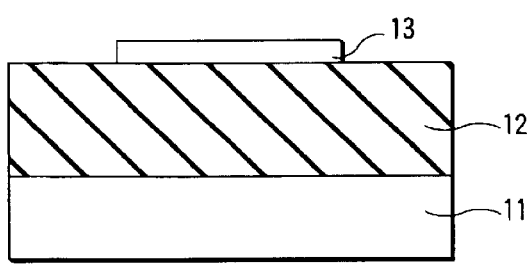
FIG. 6 is a cross sectional view showing the semiconductor device taken along the VI—VI line of FIG. 5.
Figure 7:
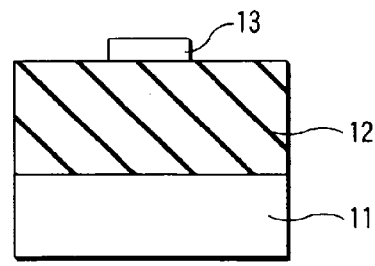
FIG. 7 is a cross sectional view showing the semiconductor device taken along the VII—VII line of FIG. 5.

First, as shown in FIGS. 5 to 7, an SOI substrate having a supporting substrate 11, buried oxide film 12 and SOI layer 13 is formed. As a material of the supporting substrate 11, for example, silicon, sapphire or the like is used. Then, the SOI layer 13 is patterned to form a portion used as an active region.

Figure 8:
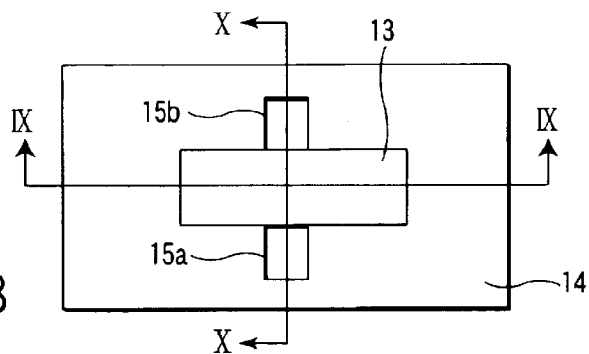
FIG. 8 is a plan view showing a manufacturing step of the semiconductor device according to the first embodiment of this invention which follows the manufacturing step of FIG. 5.
Figure 9:
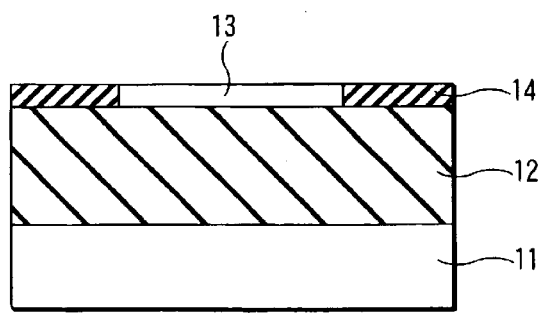
FIG. 9 is a cross sectional view showing the semiconductor device taken along the IX—IX line of FIG. 8.
Figure 10:
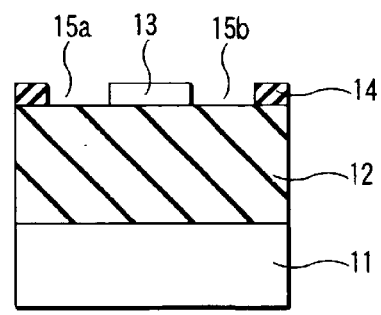
FIG. 10 is a cross sectional view showing the semiconductor device taken along the X—X line of FIG. 8.

Next, as shown in FIGS. 8 to 10, an insulating film 14 used as a device isolation region is formed on the entire surface. Then, part of the insulating film 14 is removed after the insulating film 14 is made flat until the upper surface of the SOI layer 13 is exposed. As a result, grooves 15a, 15b are formed to expose part of the side surface of the SOI layer 13 and part of the upper surface of the buried oxide film 12.

Figure 11:
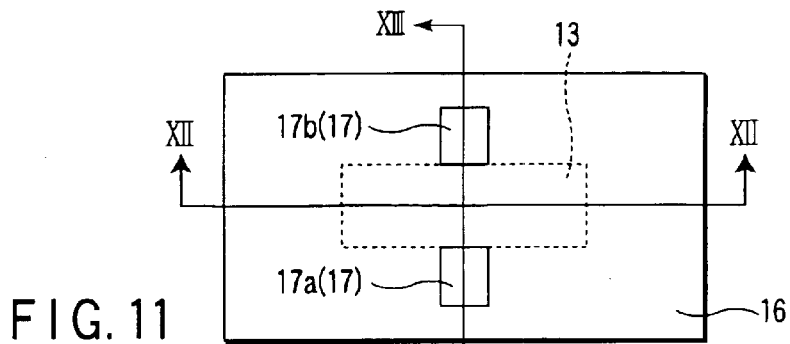
FIG. 11 is a plan view showing a manufacturing step of the semiconductor device according to the first embodiment of this invention which follows the manufacturing step of FIG. 8.
Figures 12, 13:
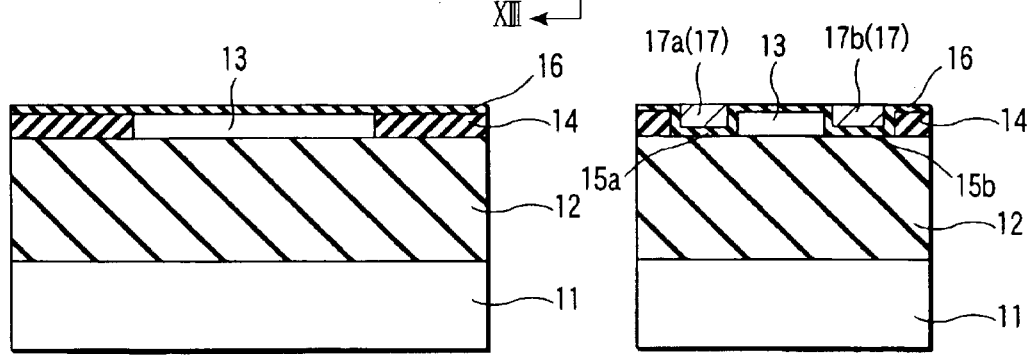
FIG. 12 is a cross sectional view showing the semiconductor device taken along the XII—XII line of FIG. 11.
FIG. 13 is a cross sectional view showing the semiconductor device taken along the XIII—XIII line of FIG. 11.

After this, as shown in FIGS. 11 to 13, a gate insulating film 16 for the side surface portions of the SOI layer 13 is formed on the entire surface. As the gate insulating film 16, for example, a thermal oxide film by the thermal oxidation method or a high-k material film by the CVD (Chemical Vapor Deposition) method or ALD (Atomic Layer Deposition) method may be used.

Next, a conductive material 17 used to form side surface gate electrodes of the SOI layer 13 are formed on the gate insulating film 16 and the grooves 15a, 15b are filled with the conductive material 17 with the gate insulating film 16 disposed therebetween. Then, the conductive material 17 is made flat until the upper surface of the gate insulating film 16 on the SOI layer 13 and insulating film 14 is exposed. As a result, the side surface gate electrodes 17a, 17b formed of the conductive material 17 are formed on the side surface portions of the SOI layer 13. The conductive material 17 is formed of a material such as (doped) polysilicon, silicide or metal. Furthermore, as the conductive material 17, a material having a work function larger than that of the upper surface gate electrode 19 is used when the MOSFET is of an n-type and a material having a work function smaller than that of the upper surface gate electrode 19 is used when the MOSFET is of a p-type.

Figure 14:
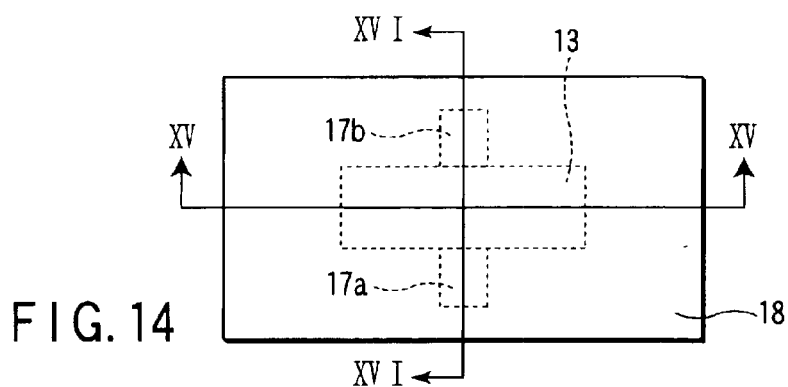
FIG. 14 is a plan view showing a manufacturing step of the semiconductor device according to the first embodiment of this invention which follows the manufacturing step of FIG. 11.
Figures 15, 16:
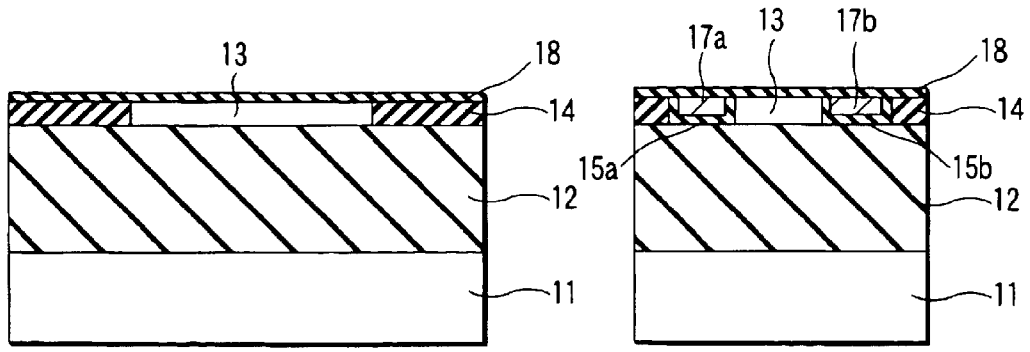
FIG. 15 is a cross sectional view showing the semiconductor device taken along the XV—XV line of FIG. 14.
FIG. 16 is a cross sectional view showing the semiconductor device taken along the XVI—XVI line of FIG. 14.

Next, as shown in FIGS. 14 to 16, part of the gate insulating film 16 which is formed at least on the SOI layer 13 is removed and a gate insulating film 18 is formed at least on the SOI layer 13. As a material of the gate insulating film 18, it is preferable to use a CVD- or ALD-series insulating film such as a high-k material film which can be formed at relatively low temperatures when taking it into consideration that the temperature in a thermally processing step is lowered.

Figure 17:
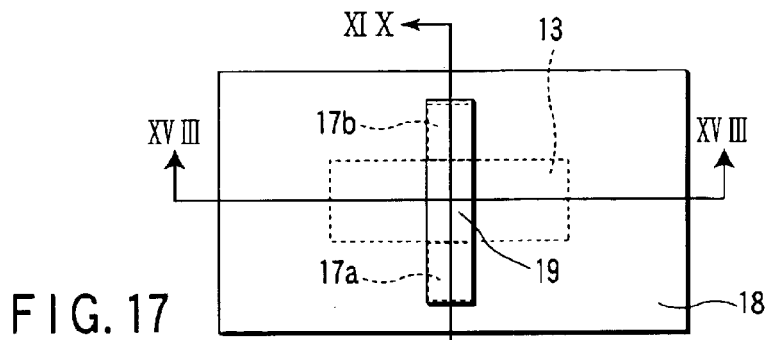
FIG. 17 is a plan view showing a manufacturing step of the semiconductor device according to the first embodiment of this invention which follows the manufacturing step of FIG. 14.
Figures 18, 19:
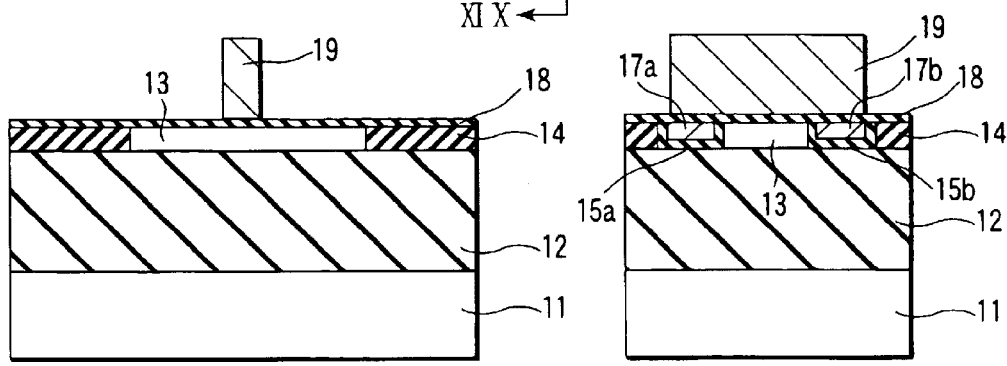
FIG. 18 is a cross sectional view showing the semiconductor device taken along the XVIII—XVIII line of FIG. 17.
FIG. 19 is a cross sectional view showing the semiconductor device taken along the XIX—XIX line of FIG. 17.

After this, as shown in FIGS. 17 to 19, a conductive material used to form the upper surface gate electrode of the SOI layer 13 is formed on the gate insulating film 18 and patterned. Thus, a gate electrode 19 formed of the conductive material is formed. As a material of the gate electrode 19, polysilicon is used, for example.

Figure 20:
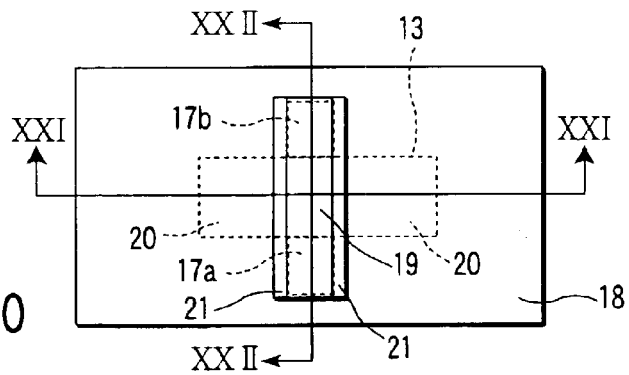
FIG. 20 is a plan view showing a manufacturing step of the semiconductor device according to the first embodiment of this invention which follows the manufacturing step of FIG. 17.
Figures 21, 22:
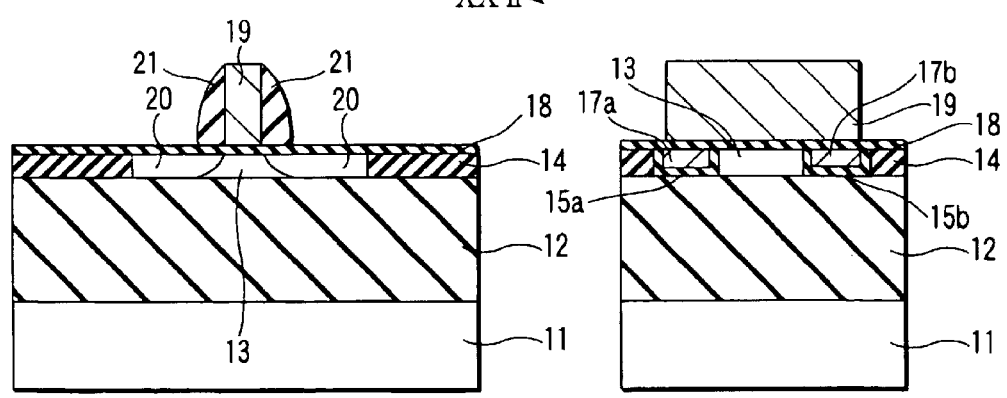
FIG. 21 is a cross sectional view showing the semiconductor device taken along the XXI—XXI line of FIG. 20.
FIG. 22 is a cross sectional view showing the semiconductor device taken along the XXII—XXII line of FIG. 20.

Next, as shown in FIGS. 20 to 22, source and drain regions 20 are formed in the SOI layer 13 by the ion-implantation process. Then, side wall insulating films 21 are formed on the side surfaces of the gate electrode 19. After this, the same process as the normal CMOS forming process is performed to complete the semiconductor device.

FIG. 23 shows three types of Id-Vg characteristics of the MOSFET of the separate gate structure in the first embodiment of this invention, the conventional MOSFET of the tri-gate structure and the conventional MOSFET (single gate) of the planar type FD-SOI structure by use of 3-dimensional device simulation with the same gate length.

In the above simulation, the gate length L of the three types of MOSFETs is set to 30 nm. Further, the film thickness Tox of the gate insulating film is set to 0.5 nm, the height Tsoi of the SOI layer is set to 20 nm and the bias voltage Vdd is set at 0.75 V. In the MOSFET of the first embodiment, it is assumed that the work function of the upper surface gate electrode 19 corresponds to that of $n^+$-type polysilicon and the work function of the side surface gate electrodes 17a, 17b corresponds to that of tungsten. Based on the above assumption, different materials are used to form the upper surface gate electrode 19 and side surface gate electrodes 17a, 17b and the bias voltages are simultaneously applied to both of the electrodes.

According to the result shown in FIG. 23, in the case of the FD-SOI structure, L=30 nm, Tsoi=20 nm and the substrate is fully depleted. Therefore, even if an extremely thin gate insulating film is formed, the short channel effect becomes severe and it is said that an off-leakage current increases. In the case of the tri-gate structure, the cutoff characteristic is improved over that of the FD-SOI structure. However, the off-leakage current is further reduced in the separate gate structure of the first embodiment than in the tri-gate structure. This is because the potential profile control by the gate with respect to the channel is increased by using the MOSFET of the 3-dimensional structure rather than the single gate MOSFET.

Furthermore, as described previously, in the tri-gate structure, it is predicted that the electric field is concentrated on corner portions in the boundaries between the upper surface portion and the side surface portions of the substrate and the corner portions functioning as parasitic transistors of low threshold voltages will be turned ON. As a result, it is considered that a slightly higher off-leakage current will occur in the low voltage region. On the other hand, in the separate gate structure of the first embodiment, depletion layers are formed to extend into the substrate in a lateral direction by the action of electric fields by the side surface gate electrodes 17a, 17b in the side surface portions of the SOI layer 13 on which the side surface gate electrodes 17a, 17b are disposed. However, in this case, since no inversion layers are formed in portions in which Vg=0 V, leakage currents due to the presence of extra parasitic transistors can be suppressed.

FIG. 24 shows the dependency of the S value on the gate length by use of 3-dimensional device simulation by using the three types of MOSFETs which are the same as those of FIG. 23.

As shown in FIG. 24, the S value of the separate gate structure in the first embodiment is smaller than that of the tri-gate structure by approximately 5 to 10 mV/dec. even when the gate length L becomes smaller. Thus, it is understood that the cutoff characteristic is favorable.

Figure 25:
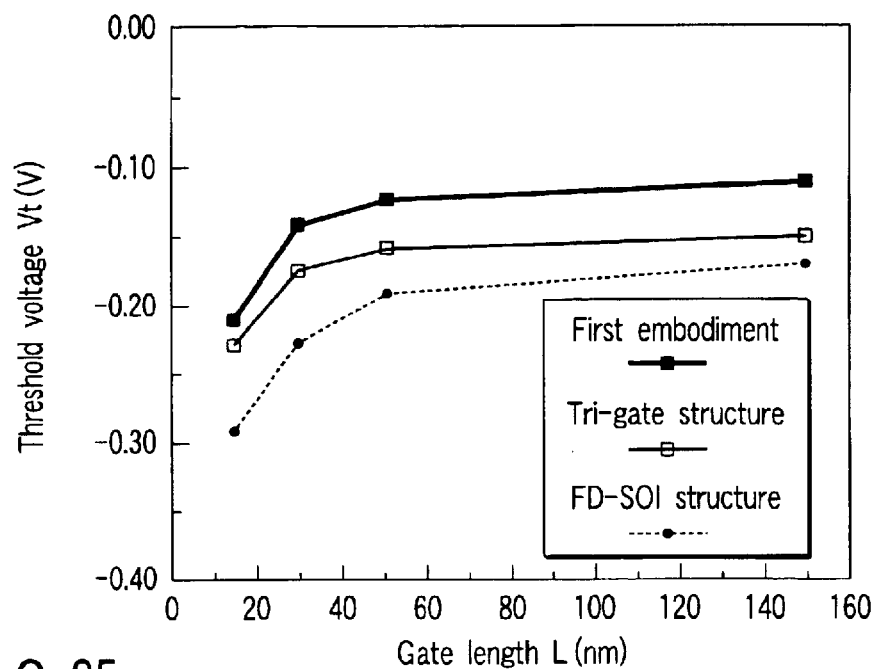
FIG. 25 is a comparison diagram of the L-Vt relations (the roll-off characteristics of Vt) of the separate gate structure, FD-SOI structure and tri-gate structure in the first embodiment of this invention.
Figure 26:
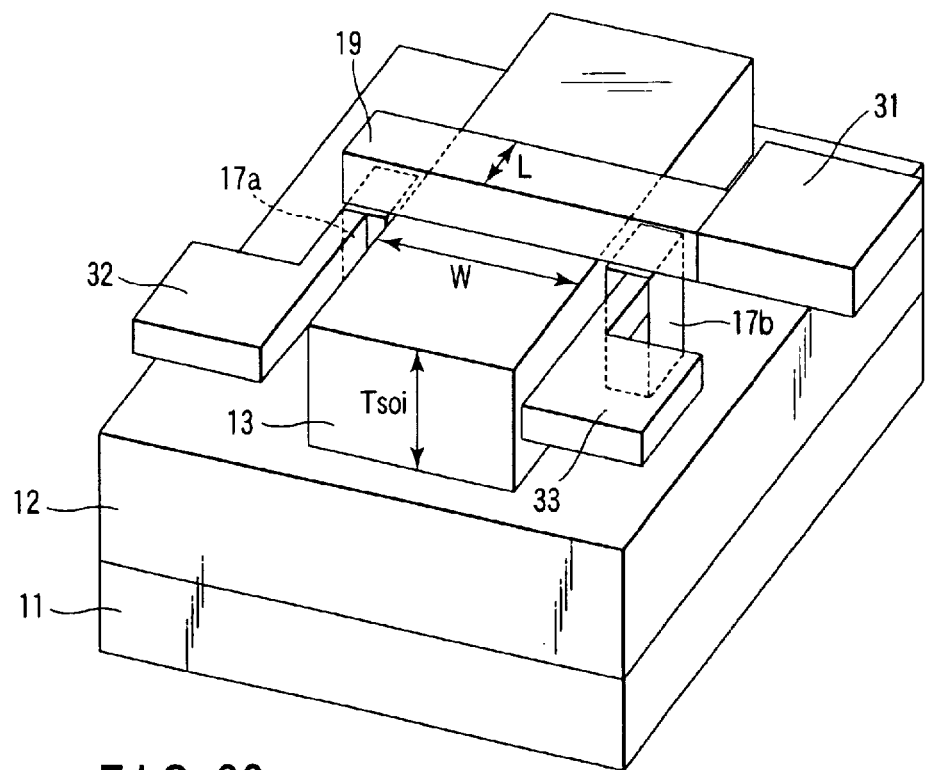
FIG. 26 is a perspective view showing a semiconductor device according to a second embodiment of this invention.
Figure 31:
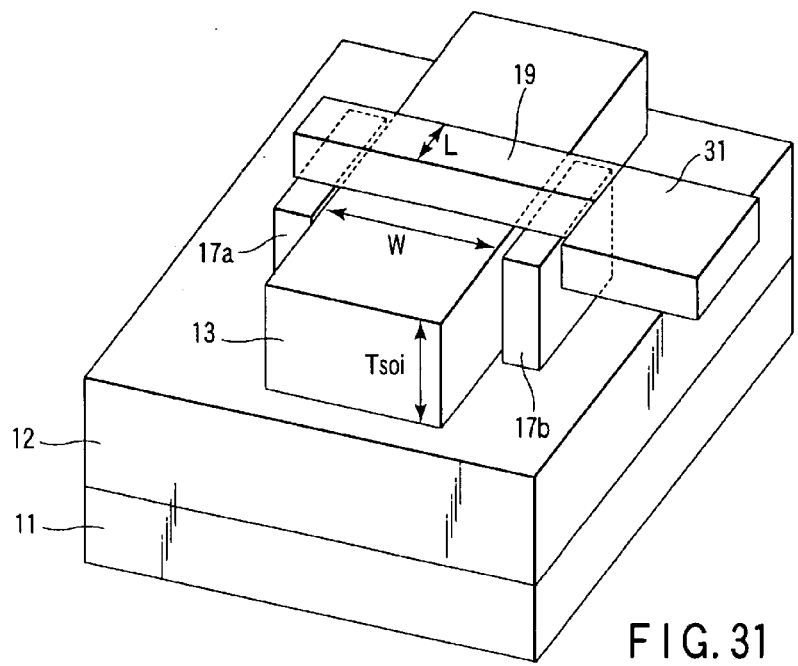
FIG. 31 is a perspective view showing a semiconductor device according to a third embodiment of this invention.
Figure 32:
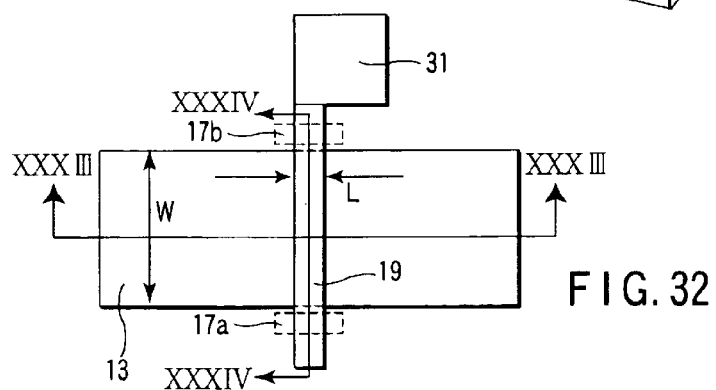
FIG. 32 is a plan view showing the semiconductor device according to the third embodiment of this invention.
Figure 33:
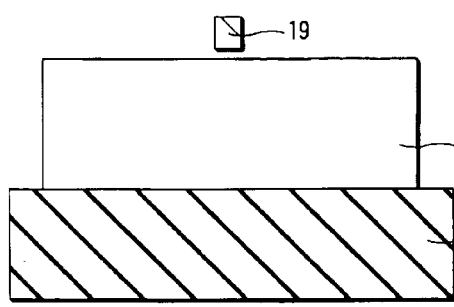
FIG. 33 is a cross sectional view showing the semiconductor device taken along the XXXIII—XXXIII line of FIG. 32.
Figure 34:
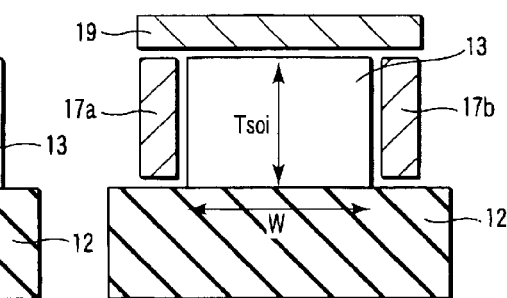
FIG. 34 is a cross sectional view showing the semiconductor device taken along the XXXIV—XXXIV line of FIG. 32.

FIG. 25 shows the roll-off characteristic of the threshold voltage Vt in the case of FIG. 23.

As shown in FIG. 25, the threshold voltage Vt of the MOSFET can be set higher in the MOSFET of the separate gate structure in the first embodiment than in the MOSFET of the FD-SOI structure or tri-gate structure. Therefore, the separate gate structure in the first embodiment is extremely advantageous over the FD-SOI structure using a polysilicon gate whose threshold voltage cannot normally be controlled.

According to the first embodiment, the separate gate structure improved over the tri-gate structure is obtained. That is, the upper surface gate electrode 19 formed on the upper surface portion of the SOI layer 13 and the side surface gate electrodes 17a, 17b formed on the side surface portions of the SOI layer 13 are formed of different materials. Furthermore, a leakage current of an extra parasitic transistor is suppressed by forming a channel in the upper surface portion only, and by applying bias voltage to cut-off in the side surface gate electrodes 17a, 17b. As a result, the short channel effect can be suppressed and the favorable cut-off characteristic can be realized in comparison with the case of the conventional tri-gate structure, which uses the miniaturized channel length, SOI film thickness and source/drain structure of the conventional MOSFET of the FD-SOI structure.

[Second Embodiment]

A second embodiment is an example in which different potentials can be applied to an upper surface gate electrode and side surface gate electrode.

FIGS. 26 to 29 are a perspective view, plan view and cross sectional views showing a semiconductor device according to the second embodiment of this invention. The semiconductor device according to the second embodiment is explained below. In this case, a structure different from that of the first embodiment is mainly explained.

As shown in FIGS. 26 to 29, in the separate gate structure according to the second embodiment, an upper surface gate electrode 19 formed on the upper surface portion of an SOI layer 13 and side surface gate electrodes 17a, 17b formed on the side surface portions of the SOI layer 13 are electrically isolated from each other. Further, lead wiring portions 31, 32, 33 are provided so as to permit different bias voltages to be applied to the gate electrodes 19, 17a, 17b. In this embodiment, like the first embodiment, the upper surface gate electrode 19 and the side surface gate electrodes 17a, 17b are formed of different materials.

FIG. 30 shows the Id-Vg characteristic of the second embodiment in comparison with that of the first embodiment of this invention. In this example, in the MOSFET of the second embodiment, voltage applied to the side surface gate electrodes 17a, 17b is fixed at Vgsg=−1.0 V and voltage applied to the upper surface gate electrode 19 is swept from −0.25 V to 0.75 V. Further, in the above simulation, the gate length L is set to 30 nm, the height Tsoi of the SOI layer is set to 20 nm and the bias voltage Vdd is set at 0.75 V. In this case, it is assumed that the work function of the upper surface gate electrode 19 corresponds to that of $n^+$-type polysilicon and the work function of the side surface gate electrodes 17a, 17b corresponds to that of tungsten.

As shown in FIG. 30, in the MOSFET of the second embodiment, the same gate electrode material as that used in the MOSFET of the first embodiment is used and it is understood that the threshold voltage is shifted due to a difference in the bias voltage application method. That is, in the second embodiment, it is understood that the threshold voltage of the MOSFET is properly controlled by the electric field caused by the side surface gate electrodes 17a, 17b.

According to the second embodiment, the same effect as that of the first embodiment can be attained.

Further, the upper surface gate electrode 19 and the side surface gate electrodes 17a, 17b are electrically isolated from each other and the lead wiring portions 31, 32, 33 are provided for the respective gate electrodes 19, 17a, 17b. Therefore, since different potentials can be applied to the upper surface gate electrode 19 and side surface gate electrodes 17a, 17b, the controllability of the threshold voltage can be further enhanced in comparison with a case of the first embodiment.

[Third Embodiment]

A third embodiment is an example in which the length of a side surface gate electrode in the channel length L direction is set larger than the length of an upper surface gate electrode in the channel length L direction.

FIGS. 31 to 34 are a perspective view, plan view and cross sectional views showing a semiconductor device according to the third embodiment of this invention. The semiconductor device according to the third embodiment is explained below. In this case, a structure different from that of the first embodiment is mainly explained.

As shown in FIGS. 31 to 34, in the separate gate structure according to the third embodiment, the length of the upper surface gate electrode 19 in the channel length L direction is made different from the length of the side surface gate electrodes 17a, 17b in the channel length L direction. In this example, the length of the side surface gate electrodes 17a, 17b in the channel length L direction is set larger than the length (=gate length L) of the upper surface gate electrode 19 in the channel length L direction. Thus, an "I-shaped" gate structure as viewed from above can be attained. The length of the upper surface gate electrode 19 in the channel length L direction is set equal to the minimum processing size of the lithography process. Further, like the first embodiment, the upper surface gate electrode 19 and side surface gate electrodes 17a, 17b are formed of different materials.

Figure 35:
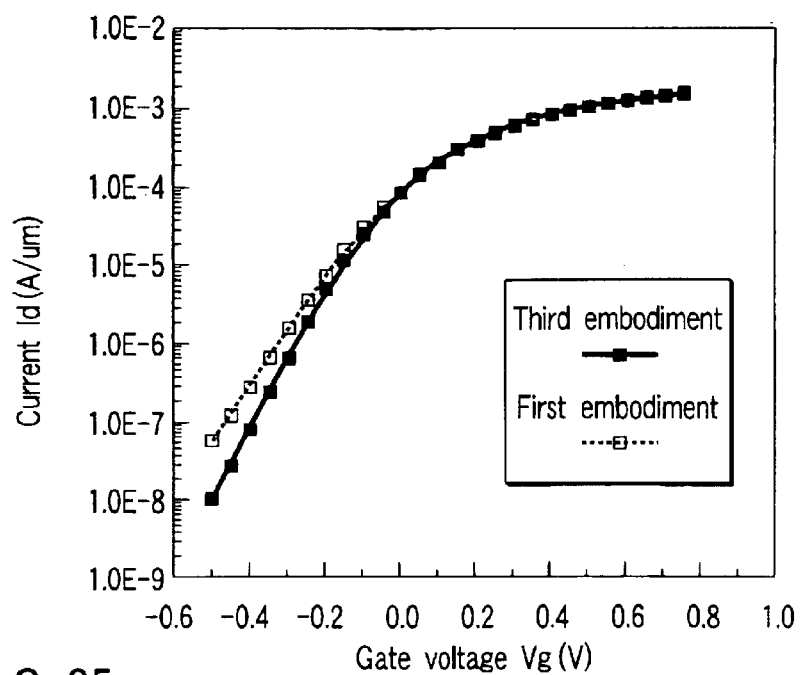
FIG. 35 is a comparison diagram of the Id-Vg characteristics of the separate gate structure in the third embodiment of this invention and the separate gate structure in the first embodiment of this invention.

FIG. 35 shows the Id-Vg characteristic of the third embodiment in comparison with that of the first embodiment of this invention. In this simulation example, the gate length L of the upper surface gate electrode is set to 15 nm, the gate length Lsg of the side surface gate electrode is set to 65 nm, the height Tsoi of the SOI layer is set to 20 nm and the bias voltage Vdd is set at 0.75 V. Further, it is assumed that the work function of the upper surface gate electrode 19 corresponds to that of polysilicon and the work function of the side surface gate electrodes 17a, 17b corresponds to that of tungsten.

As shown in FIG. 35, it is understood from the simulation result that the cutoff characteristic is more favorable in the third embodiment than in the first embodiment. It is considered that this is because the controllability by the side surface gate electrodes 17a, 17b becomes better in the third embodiment than in the first embodiment.

Figure 36:
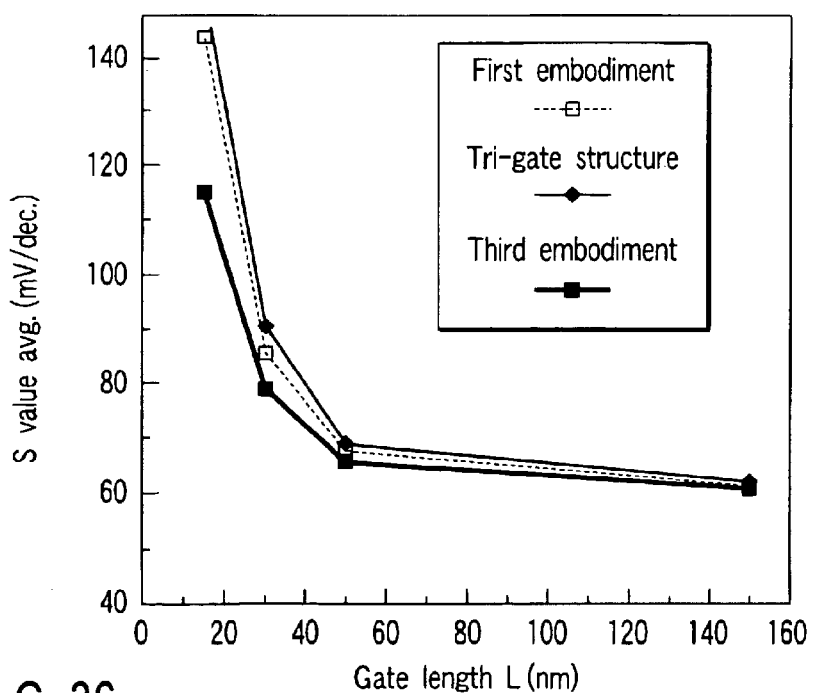
FIG. 36 is a comparison diagram of the L-S value characteristics of the separate gate structure in the third embodiment of this invention and the separate gate structure and tri-gate structure in the first embodiment of this invention.
Figure 37:
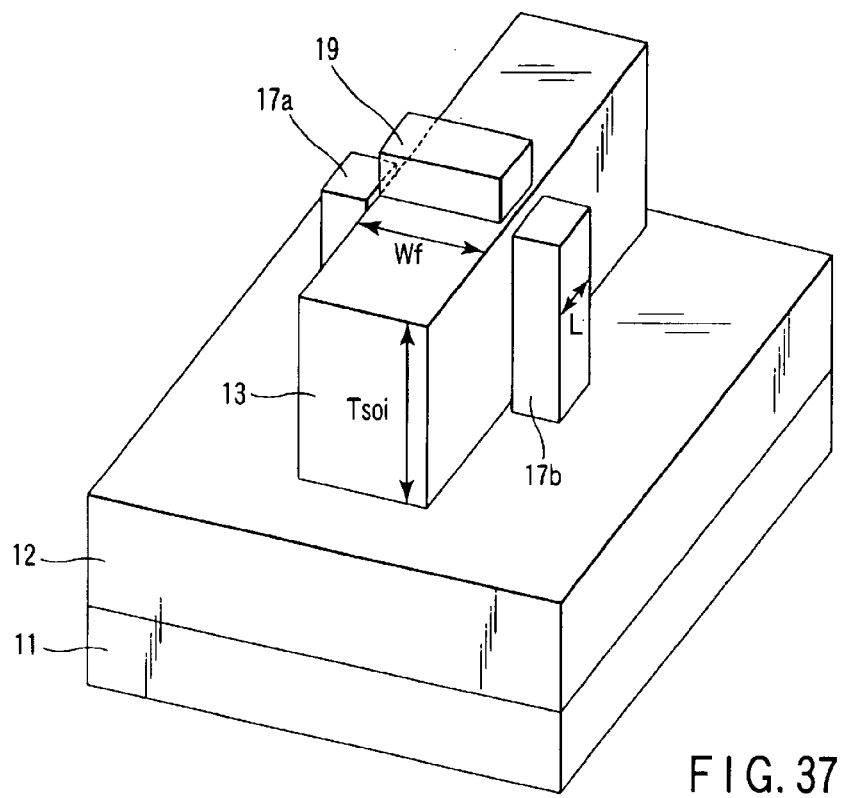
FIG. 37 is a perspective view showing a semiconductor device according to a fourth embodiment of this invention.
Figure 38:
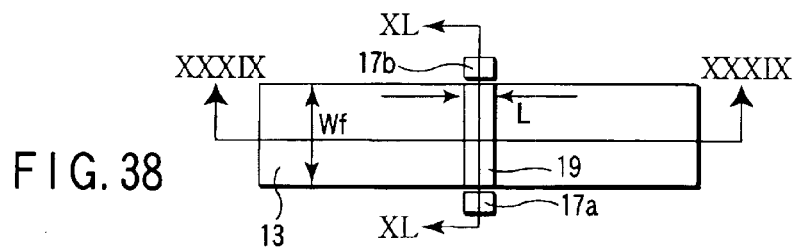
FIG. 38 is a plan view showing the semiconductor device according to the fourth embodiment of this invention.
Figure 39:
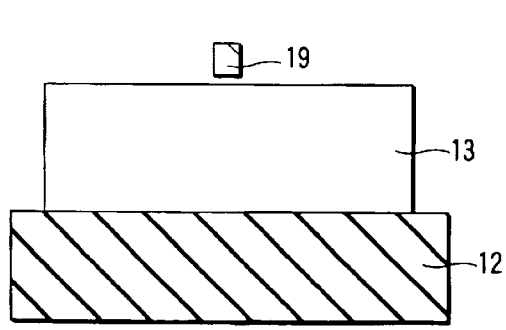
FIG. 39 is a cross sectional view showing the semiconductor device taken along the XXXIX—XXXIX line of FIG. 38.
Figure 40:
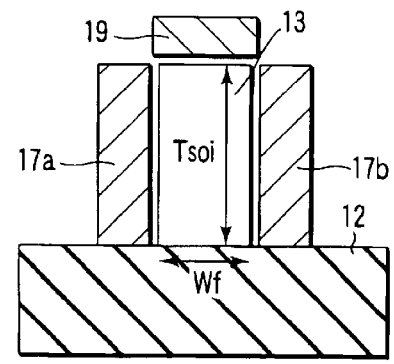
FIG. 40 is a cross sectional view showing the semiconductor device taken along the XL—XL line of FIG. 38.

FIG. 36 shows the S value of the structure of the third embodiment of this invention in comparison with the S values of the conventional tri-gate structure and the structure of the first embodiment of this invention.

As shown in FIG. 36, the S value in the structure of the third embodiment is smaller than those of the tri-gate structure and the structure of the first embodiment, which improves the cutoff characteristic.

However, in the structure of the third embodiment, it is clearly understood that parasitic capacitances formed by the side surface gate electrodes 17a, 17b become larger than those in the structure of the first embodiment. Thus, a reduction in the parasitic capacitance and the enhancement of the cutoff characteristic is a trade-off relationship.

According to the third embodiment, the same effect as that of the first embodiment can be attained.

Further, in this embodiment, the length of the side surface gate electrodes 17a, 17b in the channel length L direction is set larger than the length of the upper surface gate electrode 19 in the channel length L direction. Therefore, an influence by the action of the side surface gate electrodes 17a, 17b on the potential in a portion near the channel can be further increased. Thus, the cutoff characteristic can be further improved.

In the structure of the third embodiment, it is not necessary to form the side surface gate electrodes 17a, 17b and the upper surface gate electrode 19 in a self-aligned manner. Therefore, the resistance to some misalignment between the side surface gate electrodes 17a, 17b and the upper surface gate electrode 19 can be acquired. As a result, it is only necessary to draw only the upper surface gate electrode 19 according to the minimum processing size of the lithography process. Thus, an advantage that the lithography process for the gate electrodes 17a, 17b, 19 is simplified can be attained.

[Fourth Embodiment]

In the first embodiment, the upper surface gate electrode functions to form the channel and the side surface gate electrodes function as the control gates. On the other hand, in the fourth embodiment, side surface gate electrodes function to form a channel and an upper surface gate electrode functions as a control gate.

FIGS. 37 to 40 are a perspective view, plan view and cross sectional views showing a semiconductor device according to the fourth embodiment of this invention. The semiconductor device according to the fourth embodiment is explained below. In this case, a structure different from that of the first embodiment is mainly explained.

As shown in FIGS. 37 to 40, in the separate gate structure in the fourth embodiment, a channel portion is formed by use of side surface gate electrodes 17a, 17b in a so-called fin FET structure and potential is applied to cut off the channel portion by use of an upper surface gate electrode 19.

The upper surface gate electrode 19 and side surface gate electrodes 17a, 17b are formed of different materials. For example, the upper surface gate electrode 19 and side surface gate electrodes 17a, 17b are formed of the following materials.

When the MOSFET is of an n-type, the upper surface gate electrode 19 may be formed of a material of refractory metal or silicide (for example, W, TiN, Ni) of the refractory metal and the side surface gate electrodes 17a, 17b may be formed of a material of n$^+$-type polysilicon. Further, when the MOSFET is of an n-type, the upper surface gate electrode 19 may be formed of a material of p$^+$-type polysilicon and the side surface gate electrodes 17a, 17b may be formed of a material of n$^+$-type polysilicon.

When the MOSFET is of a p-type, the upper surface gate electrode 19 may be formed of a material of refractory metal or silicide (for example, W, TiN, Ni) of the refractory metal and the side surface gate electrodes 17a, 17b may be formed of a material of p$^+$-type polysilicon. Further, when the MOSFET is of a p-type, the upper surface gate electrode 19 may be formed of a material of n$^+$-type polysilicon and the side surface gate electrodes 17a, 17b may be formed of a material of p$^+$-type polysilicon.

When the gate electrodes 17a, 17b, 19 are formed of a metal-series material, it becomes easy to configure a CMOS by use of the FD type MOSFET if a metal-series material (for example, refractory metal or silicide of the refractory metal) having a work function which is approximately equal to that of the mid gap of silicon is used.

Further, the work function $\phi m1$ of the upper surface gate electrode 19 and the work functions $\phi m2$, $\phi m3$ of the side surface gate electrodes 17a, 17b are different. For example, when the MOSFET is of an n-type, the following expression (6) is satisfied and when the MOSFET is of a p-type, the following expression (7) is satisfied.

$$\phi m1 > \phi m2 \text{ and } \phi m1 > \phi m3 \qquad (6)$$

$$\phi m1 < \phi m2 \text{ and } \phi m1 < \phi m3 \qquad (7)$$

That is, when the MOSFET is of an n-type, a material having a work function larger than that of the side surface gate electrodes 17a, 17b is used for the upper surface gate electrode 19 so as not to form a channel of a parasitic transistor in the upper surface portion of the SOI layer 13. On the other hand, when the MOSFET is of a p-type, a material having a work function smaller than that of the side surface gate electrodes 17a, 17b is used for the upper surface gate electrode 19 so as not to form a channel of a parasitic transistor in the upper surface portion of the SOI layer 13.

In a case where the expressions (6), (7) are satisfied, the work functions $\phi m2$, $\phi m3$ may be made different, but it is desirable to set them equal to each other. Therefore, it is preferable to form the side surface gate electrodes 17a, 17b by use of the same material rather than by use of different materials.

Further, in the MOSFET of the first embodiment, a portion lying under the side surface gate electrodes 17a, 17b functions as a channel. Therefore, a drain current flows in the short side direction (channel length L direction) of the side surface gate electrodes 17a, 17b.

If the height of the SOI layer 13 is H, gate voltage applied to the upper surface gate electrode 19 is Vgtg and the width of a depletion layer formed by the action of the upper surface gate electrode 19 when Vgtg is set at 0 V is Wd, the following expression (8) is satisfied.

$$H<Wd \qquad (8)$$

Since the potential profile control by the upper surface gate electrode 19 has a limitation, it is necessary to impose some limitation on the height H of the SOI layer 13. Therefore, the relation expressed by the expression (8) is derived to maintain the good cutoff characteristic when Vgsg is set at 0 V, for example.

Figure 41:
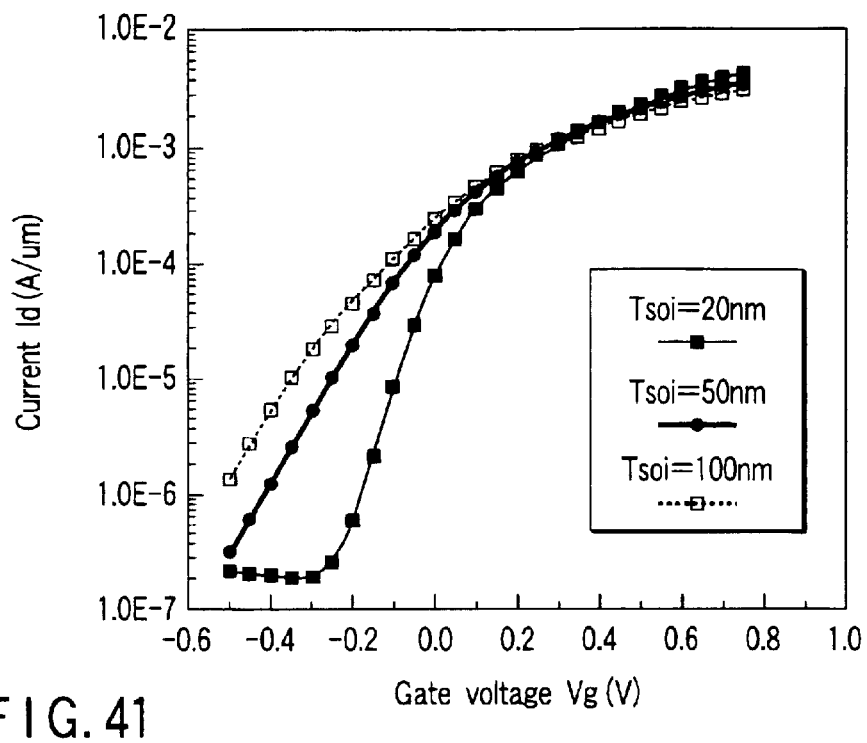
FIG. 41 is a comparison diagram of the Id-Vg characteristics of the separate gate structure in the fourth embodiment of this invention with the height of a fin used as a parameter.
Figure 42:
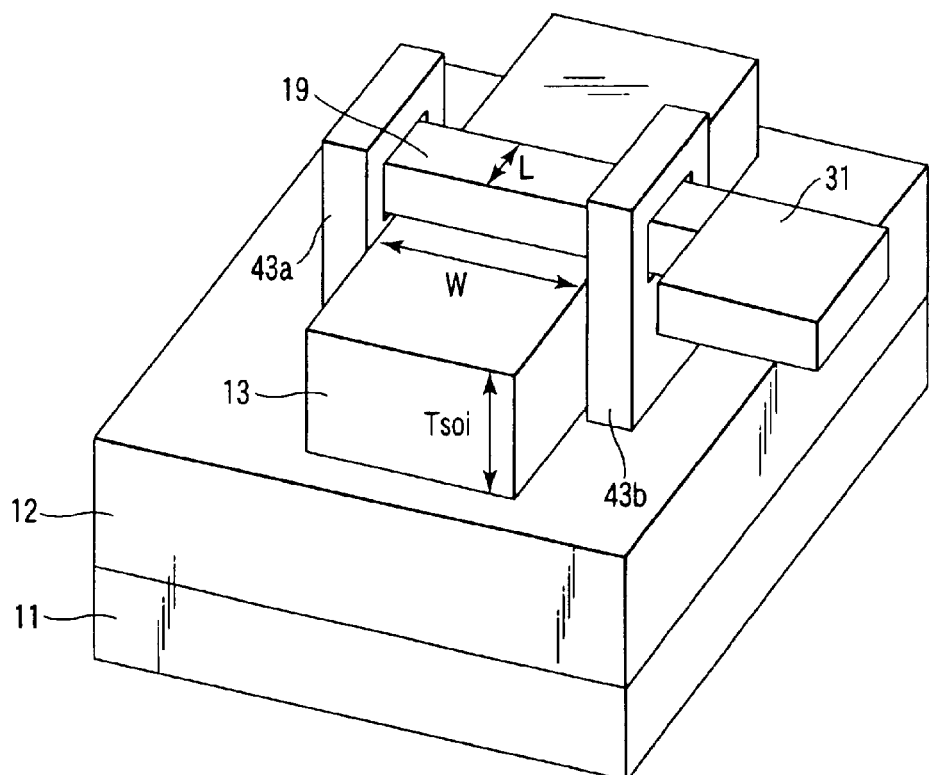
FIG. 42 is a perspective view showing a semiconductor device according to a fifth embodiment of this invention.
Figure 43:
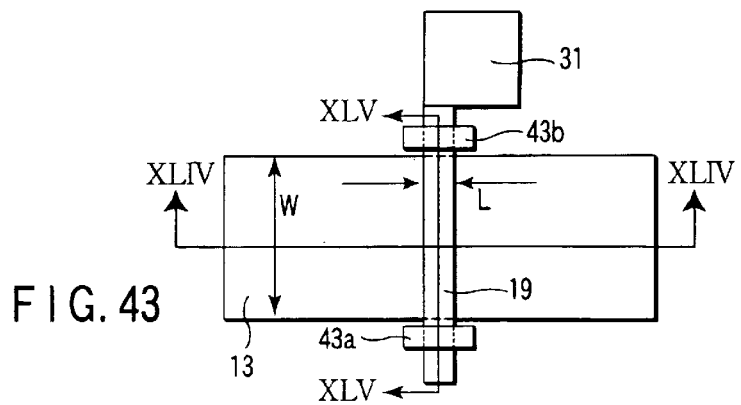
FIG. 43 is a plan view showing the semiconductor device according to the fifth embodiment of this invention.
Figures 44, 45:
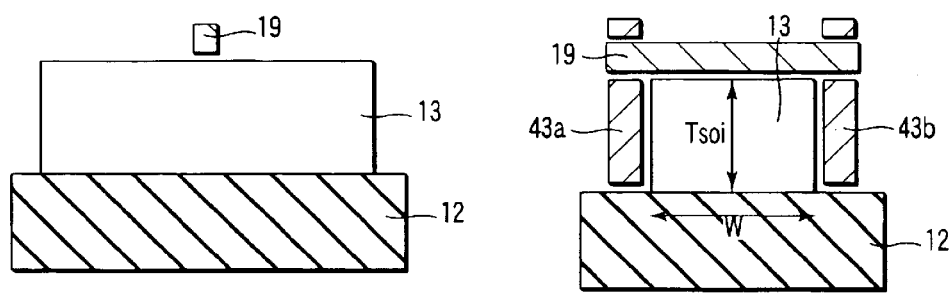
FIG. 44 is a cross sectional view showing the semiconductor device taken along the XLIV—XLIV line of FIG. 43.
FIG. 45 is a cross sectional view showing the semiconductor device taken along the XLV—XLV line of FIG. 43.

FIG. 41 shows the Id-Vg characteristics in the fourth embodiment. In the above simulation, the height Tsoi of the fin is used as a parameter and the Id-Vg characteristics are compared when the height Tsoi is set to 20 nm, 50 nm and 100 nm. Further, the gate length L is set to 30 nm, the fin width Wf is set to 50 nm and the bias voltage Vdd is set at 0.75 V. In this case, it is assumed that the work function of the upper surface gate electrode 19 corresponds to that of tungsten and the work function of the side surface gate electrodes 17a, 17b corresponds to that of $n^+$-type polysilicon.

According to the result shown in FIG. 41, when the height Tsoi of the fin is small, the cutoff effect by the upper surface gate electrode 19 can be observed. However, as the height of the fin increases, the short channel suppression effect by the potential profile control of the upper surface gate electrode 19 becomes weak and punch through occurs. This is because the structure is controlled only by use of the single gate (upper surface gate electrode 19) and has weaker resistance to the short channel effect in comparison with the structures which are controlled by use of the double gate (side surface gate electrodes 17a, 17b) as explained in the first to third embodiments.

According to the fourth embodiment, like the first embodiment, the upper surface gate electrode 19 formed on the upper surface portion of the SOI layer 13 and the side surface gate electrodes 17a, 17b formed on the side surface portions of the SOI layer 13 are formed of different materials. However, unlike the first embodiment, a channel is formed by use of the side surface gate electrodes 17a, 17b and a potential which cuts off the channel is applied by use of the upper surface gate electrode 19 to suppress a leakage current of an extra parasitic transistor. As a result, the favorable cutoff characteristic can be realized.

Like the second embodiment, in the structure of the fourth embodiment, the side surface gate electrodes 17a, 17b and the upper surface gate electrode 19 are electrically isolated from each other. Further, lead wiring portions 31, 32, 33 may be provided so that different potentials can be applied to the gate electrodes 19, 17a, 17b.

Further, like the third embodiment, in the fourth embodiment, the lengths of the channels formed by the side surface gate electrodes 17a, 17b and the upper surface gate electrode 19 can be changed. For example, in the case of the fourth embodiment, the length of the upper surface gate electrode 19 in the channel length direction can be made larger than the length of the side surface gate electrodes 17a, 17b in the channel length direction. As a result, an influence by the upper surface gate electrode 19 on the potential in a portion near the channel can be increased and the cutoff characteristic can be further improved. In this case, the length of the side surface gate electrodes 17a, 17b in the channel length direction can be set to the minimum processing size of the lithography process.

[Fifth Embodiment]

A fifth embodiment is a modification of the first embodiment and is an example in which an upper surface gate electrode is formed to penetrate through side surface gate electrodes.

FIGS. 42 to 45 are a perspective view, plan view and cross sectional views showing a semiconductor device according to the fifth embodiment of this invention. The semiconductor device according to the fifth embodiment is explained below. In this case, a structure different from that of the first embodiment is mainly explained.

As shown in FIGS. 42 to 45, in the separate gate structure in the fifth embodiment, side surface gate electrodes 43a, 43b are formed to extend over the upper surface of an upper surface gate electrode 19 and the upper surface gate electrode 19 is formed to penetrate through the side surface gate electrodes 43a, 43b. Like the first embodiment, the upper surface gate electrode 19 and side surface gate electrodes 43a, 43b are formed of different materials.

FIGS. 46 to 56 are plan views and cross sectional views showing a manufacturing process of the semiconductor device according to the fifth embodiment of this invention. The manufacturing method of the semiconductor device according to the fifth embodiment is explained below.

Figure 46:
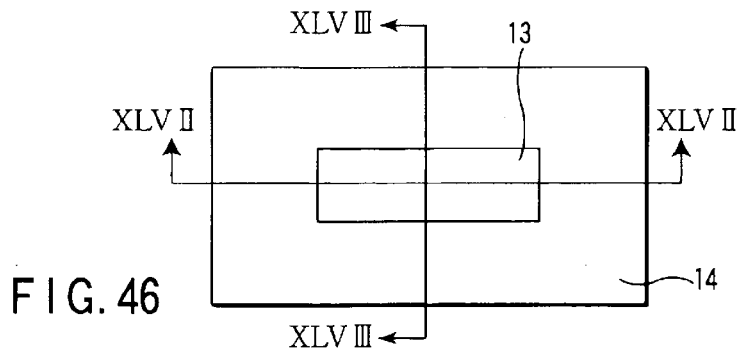
FIG. 46 is a plan view showing a manufacturing step of the semiconductor device according to the fifth embodiment of this invention.
Figures 47, 48:
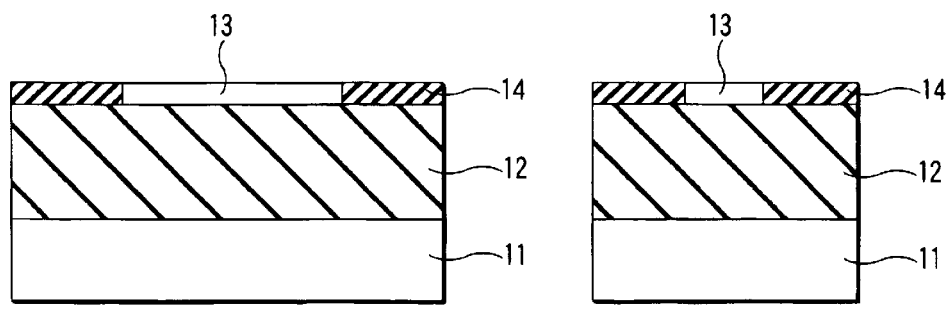
FIG. 47 is a cross sectional view showing the semiconductor device taken along the XLVII—XLVII line of FIG. 46.
FIG. 48 is a cross sectional view showing the semiconductor device taken along the XLVIII—XLVIII line of FIG. 46.

First, as shown in FIGS. 46 to 48, an SOI substrate having a supporting substrate 11, buried oxide film 12 and SOI layer 13 is formed. Then, the SOI layer 13 is patterned to form a portion used as an active region. After this, an insulating film 14 used as a device isolation region is formed on the entire surface. Then, the insulating film 14 is made flat until the upper surface of the SOI layer 13 is exposed.

Next, as shown in FIGS. 49 to 51, a gate insulating film 18 is formed on the insulating film 14 and the SOI layer 13 which is made flat. Then, a conductive material is formed on the gate insulating film 18 and patterned. As a result, an upper surface gate electrode 19 formed of the conductive material is formed.

After this, as shown in FIGS. 52 to 54, source and drain regions 20 are formed in the SOI layer 13 by use of the ion-implantation technique. Then, side wall insulating films 21 are formed on the side surfaces of the upper surface gate electrode 19.

Next, as shown in FIGS. 55 to 57, a passivation film 41 is formed on the entire surface and the upper surface thereof is made flat. Then, a resist (not shown) is formed on the passivation film 41 and patterned into a shape corresponding to side surface gate electrodes. After this, the passivation film 41, gate insulating film 18 and insulating film 14 are selectively etched with the patterned resist used as a mask. As the etching process, a dry etching process or controlled wet etching process may be performed. However, preferably, an isotropic dry etching (for example, CDE) process may be performed to remove portions of the insulating films 14, 18 which lie under the gate electrode 19 after an anisotropic etching (for example, RIE) process is performed. Thus, grooves 42a, 42b used for formation of side surface gate electrodes are formed.

Figures 59, 60:
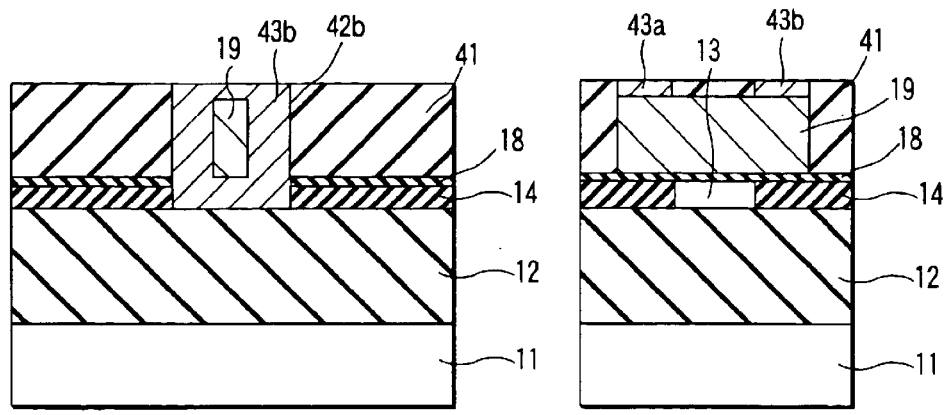
FIG. 59 is a cross sectional view showing the semiconductor device taken along the LIX—LIX line of FIG. 58.
FIG. 60 is a cross sectional view showing the semiconductor device taken along the LX—LX line of FIG. 58.

Next, as shown in FIGS. 58 to 60, a gate insulating film (not shown) used for the side surface gate electrodes is formed. Then, a conductive material is formed on the entire surface and made flat by a damascene process. Thus, side surface gate electrodes 43a, 43b are formed in the grooves 42a, 42b. The side surface gate electrodes 43a, 43b are formed to extend over the two end portions of the upper surface gate electrode 19 in the lengthwise direction thereof and are also formed under the two end portions. That is, a structure in which the upper surface gate electrode 19 penetrates through the side surface gate electrodes 43a, 43b is completed.

According to the fifth embodiment, not only the same effect as that of the first embodiment can be attained but also the following effect can be attained.

In the manufacturing method of the first embodiment, the thermal processing step associated with formation of the source and drain regions 20 is performed after the side surface gate electrodes 17a, 17b are formed. Therefore, it is necessary to select a material which is used to form the side surface gate electrodes 17a, 17b and has sufficiently high resistance to heat caused in the thermal processing step for activation of the source and drain regions. On the other hand, in the manufacturing method of the fifth embodiment, the side surface gate electrodes 43a, 43b are formed after the thermal processing step associated with formation of the source and drain regions is performed. Therefore, it is possible to use a material having low heat-resistance in order to form the side surface gate electrodes 43a, 43b. Thus, the degree of freedom of material selection for the side surface gate electrodes 43a, 43b is enhanced.

According to various types of the separate gate structures in the above embodiments of this invention, the favorable cutoff characteristic can be realized by suppressing the short channel effect while the minute gate length is attained. However, since the various types of separate gate structures have merits and demerits, it becomes necessary to select one of the various types of separate gate structures according to the required item.

Further, in the separate gate structures of the above embodiments of this invention, a case wherein the SOI substrate is used is explained, but this is not limitative. For example, the separate gate structure of each of the above embodiments of this invention can be realized by use of a normal bulk substrate. In this case, for example, a bulk substrate disclosed in S. Inaba & K. Ohuchi, U.S. Pat. No. 6,525,403 (Date of Patent Feb. 25, 2003: Filed Sep. 24, 2001), Jpn. Pat. Appln. KOKAI Publication No. 2002-110963 and the like can be used.

Figure 61:
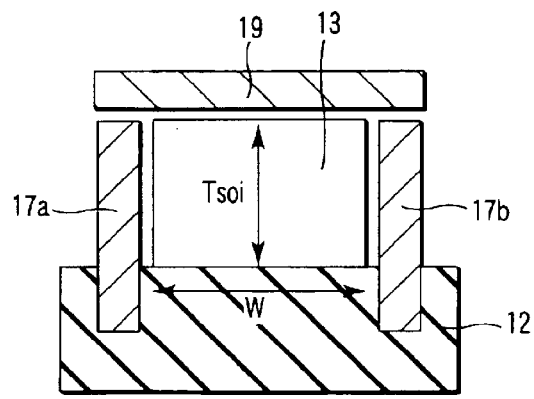
FIG. 61 is a cross sectional view showing another semiconductor device according to each embodiment of this invention.
Figure 62:
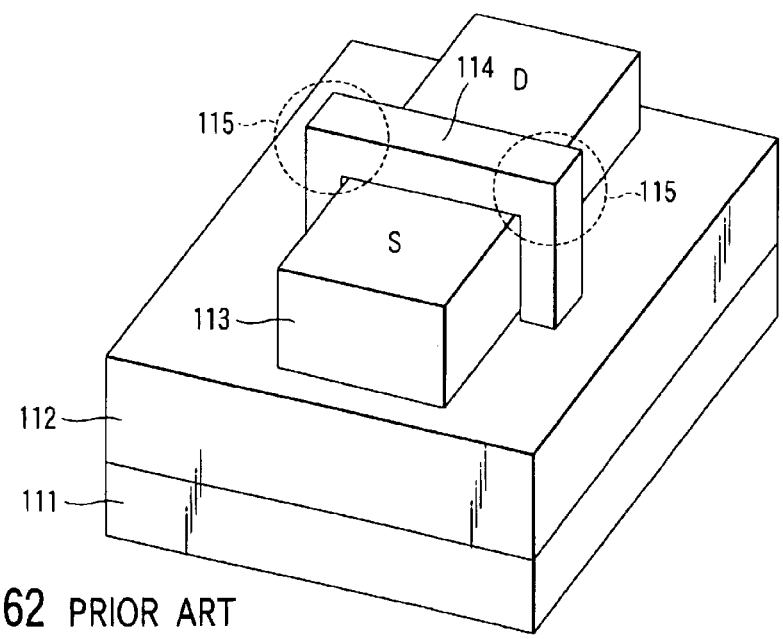
FIG. 62 is a perspective view showing the conventional MOSFET of the tri-gate structure taken along a line in a direction of the channel width W.

In the separate gate structure of each of the above embodiments of this invention, the undersurface of the side surface gate electrodes 17a, 17b, 43a, 43b is set higher than the upper surface of the buried oxide film 12, but this is not limitative. For example, the undersurface of the side surface gate electrode can be set equal in height to the upper surface of the buried oxide film 12. Further, no problem will occur even if the undersurface of the side surface gate electrode is set in a position deeper than the bottom surface of the active region (the bottom surface of the SOI layer when the SOI substrate is used). In this case, it is expected that the cutoff characteristic can be improved. Therefore, for example, when the SOI substrate is used, as shown in FIG. 61, the lower portions of the side surface gate electrodes 17a, 17b may be formed to extend into the buried oxide film 12.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

an active layer having a first side surface, a second side surface perpendicular to the first side surface and a third side surface opposite to the second side surface, a first gate electrode arranged on the first side surface with a first gate insulating film disposed therebetween a second gate electrode formed of a material different from that of the first gate electrode and arranged on the second side surface with a second gate insulating film disposed therebetween a third gate electrode formed of a material different from that of the first gate electrode and arranged on the third side surface with a third gate insulating film, disposed therebetween and an insulating film formed under the active layer lower portions of the second and third gate electrodes extended into the insulating film.

2. A semiconductor device comprising:

an active layer having a first side surface, a second side surface perpendicular to the first side surface and a third side surface opposite to the second side surface, a first gate electrode arranged on the first side surface with a first gate insulating film disposed therebetween, a second gate electrode formed of a material different from that of the first gate electrode and arranged on the second side surface with a second gate insulating film disposed therebetween and a third gate electrode formed of a material different from that of the first gate electrode and arranged on the third side surface with a third gate insulating film disposed therebetween wherein the first gate electrode is formed in contact with the second and third gate electrodes.

3. A semiconductor device comprising:

an active layer having a first side surface, a second side surface perpendicular to the first side surface and a third side surface opposite to the second side surface, a first gate electrode arranged on the first side surface with a first gate insulating film disposed therebetween a second gate electrode formed of a material different from that of the first gate electrode and arranged on the second side surface with a second gate insulating film disposed therebetween, and a third gate electrode formed of a material different from that of the first gate electrode and arranged on the third side surface with a third gate insulating film disposed therebetween, wherein the relation of $\phi m1 < \phi m2$ and $\phi m1 < \phi m3$ is satisfied when a work function of the first gate electrode is $\phi\phi m1$, a work function of the second gate electrode is $\phi m2$ and a work function of the third gate electrode is $\phi m3$ in a case where a transistor having the first to third gate electrodes is of an n-type, and a dram current of the transistor flows in a short side direction of the first gate electrode under the first gate electrode.

4. The semiconductor device according to claim 3, wherein a material of the first gate electrode is $n^+$-type polysilicon and a material of each of the second and third gate electrodes is p⁺-type polysilicon.

5. The semiconductor device according to claim 3, wherein the relation of W<2Wd is satisfied when the channel width is W, gate voltage applied to the second or third gate electrode is Vgsg and width of a depletion layer formed by the action of the second or third gate electrode at the time of Vgsg=0 V is Wd.

6. The semiconductor device according to claim 3, wherein second length of the second gate electrode in the channel length direction and third length of the third gate electrode in the channel length direction are larger than first length of the first gate electrode in the channel length direction.

7. The semiconductor device according to claim 3, wherein a material of the first gate electrode is n⁺-type polysilicon and a material of each of the second and third gate electrodes is a refractory metal or silicide of the refractory metal.

8. The semiconductor device according to claim 7, wherein the refractory metal or silicide of the refractory metal which is the material of the second and third gate electrodes has substantially the same work function as that of a mid gap of silicon.

9. A semiconductor device comprising:
an active layer having a first side surface, a second side surface perpendicular to the first side surface and a third side surface opposite to the second side surface,
a first gate electrode arranged on the first side surface with a first gate insulating film disposed therebetween,
a second gate electrode formed of a material different from that of the first gate electrode and arranged on the second side surface with a second gate insulating film disposed therebetween, and
a third gate electrode formed of a material different from that of the first gate electrode and arranged on the third side surface with a third gate insulating film disposed therebetween,
wherein the relation of φm1>φm2 and φm1>φm3 is satisfied when a work function of the first gate electrode is φm1, a work function of the second gate electrode is φm2 and a work function of the third gate electrode is φm3 in a case where a transistor having the first to third gate electrodes is of a p-type, and a drain current of the transistor flows in a short side direction of the first gate electrode under the first gate electrode.

10. The semiconductor device according to claim 9, wherein a material of the first gate electrode is p⁺-type polysilicon and a material of each of the second and third gate electrodes is a refractory metal or silicide of the refractory metal.

11. The semiconductor device according to claim 9, wherein a material of the first gate electrode is p⁺-type polysilicon and a material of each of the second and third gate electrodes is n⁺-type polysilicon.

12. A semiconductor device comprising:
an active layer having a first side surface, a second side surface perpendicular to the first side surface and a third side surface opposite to the second side surface,
a first gate electrode arranged on the first side surface with a first gate insulating film disposed therebetween,
a second gate electrode formed of a material different from that of the first gate electrode and arranged on the second side surface with a second gate insulating film disposed therebetween, and
a third gate electrode formed of a material different from that of the first gate electrode and arranged on the third side surface with a third gate insulating film disposed therebetween wherein the relation of φm1>φm2 and φm1>φm3 is satisfied when a work function of the first gate electrode is φm1, a work function of the second gate electrode is φm2 and a work function of the third gate electrode is φm3 in a case where a transistor having the first to third gate electrodes is of an n-type, and a drain current of the transistor flows in a short side direction of the second and third gate electrodes under the second and third gate electrodes.

13. The semiconductor device according to claim 12, wherein a material of the first gate electrode is p⁺-type polysilicon and a material of each of the second and third gate electrodes is n⁺-type polysilicon.

14. The semiconductor device according to claim 12, wherein the relation of H<Wd is satisfied when height of the active layer is H, gate voltage applied to the first gate electrode is Vgtg and width of a depletion layer formed by the action of the first gate electrode at the time of Vgtg=0 V is Wd.

15. The semiconductor device according to claim 12, wherein first length of the first gate electrode in the channel length direction is larger than second length of the second gate electrode in the channel length direction and third length of the third gate electrode in the channel length direction.

16. The semiconductor device according to claim 12, wherein a material of the first gate electrode is a refractory metal or silicide of the refractory metal and a material of each of the second and third gate electrodes is n⁺-type polysilicon.

17. The semiconductor device according to claim 16, wherein the refractory metal or silicide of the refractory metal which is the material of the first gate electrode has substantially the same work function as that of a mid gap of silicon.

18. A semiconductor device comprising:
an active layer having a first side surface, a second side surface perpendicular to the first side surface and a third side surface opposite to the second side surface,
a first gate electrode arranged on the first side surface with a first gate insulating film disposed therebetween,
a second gate electrode formed of a material different from that of the first gate electrode and arranged on the second side surface with a second gate insulating film disposed therebetween, and
a third gate electrode formed of a material different from that of the first gate electrode and arranged on the third side surface with a third gate insulating film disposed therebetween,
wherein the relation of φm1<φm2 and φm1<φm3 is satisfied when a work function of the first gate electrode is φm1, a work function of the second gate electrode is φm2 and a work function of the third gate electrode is φm3 in a case where a transistor having the first to third gate electrodes is of a p-type, and a drain current of the transistor flows in a short side direction of the second and third gate electrodes under the second and third gate electrodes.

19. The semiconductor device according to claim 18, wherein a material of the first gate electrode is a refractory metal or silicide of the refractory metal and a material of each of the second and third gate electrodes is p⁺-type polysilicon.

20. The semiconductor device according to claim 18, wherein a material of the first gate electrode is n⁺-type polysilicon and a material of each of the second and third gate electrodes is p⁺-type polysilicon.

21. A semiconductor device comprising:
an active layer having a first side surface a second side surface perpendicular to the first side surface and a third side surface opposite to the second side surface,
a first gate electrode arranged on the first side surface with a first gate insulating film disposed therebetween,
a second gate electrode formed of a material different from that of the first gate electrode and arranged on the second side surface with a second gate insulating film disposed therebetween, and
a third gate electrode formed of a material different from that of the first gate electrode and arranged on the third side surface with a third gate insulating film disposed therebetween
wherein first length of the first gate electrode in the channel length direction is different from second length of the second gate electrode in the channel length direction and third length of the third gate electrode in the channel length direction.

22. A semiconductor device comprising:
an active layer having a first side surface, a second side surface perpendicular to the first side surface and a third side surface opposite to the second side surface
a first gate electrode arranged on the first side surface with a first gate insulating film disposed therebetween
a second gate electrode formed of a material different from that of the first gate electrode and arranged on the second side surface with a second gate insulating film disposed therebetween, and
a third gate electrode formed of a material different from that of the first gate electrode and arranged on the third side surface with a third gate insulating film disposed therebetween
wherein the first gate electrode is formed to penetrate through the second and third gate electrodes.

23. A manufacturing method of a semiconductor device comprising:
forming an active layer having a first side surface, a second side surface perpendicular to the first side surface and a third side surface opposite to the second side surface,
forming a first insulating film having first and second grooves formed to expose the second and third side surfaces around the active layer,
forming a first gate electrode on the first side surface with a first gate insulating film disposed therebetween, forming a second gate electrode on the second side surface in the first groove with a second gate insulating film disposed therebetween by use of a material different from that of the first gate electrode and forming a third gate electrode on the third side surface in the second groove with a third gate insulating film disposed therebetween by use of a material different from that of the first gate electrode, and
forming source and drain regions in the active layer.

24. A manufacturing method of a semiconductor device comprising:
forming an active layer having a first side surface, a second side surface perpendicular to the first side surface and a third side surface opposite to the second side surface, and
forming a first gate electrode on the first side surface with a first gate insulating film disposed therebetween forming a second gate electrode on the second side surface with a second gate insulating film disposed therebetween by use of a material different from that of the first gate electrode, and forming a third gate electrode on the third side surface with a third gate insulating film disposed therebetween by use of a material different from that of the first gate electrode,
wherein the first to third gate electrodes are formed of materials which satisfy the relation of $\phi m1 < \phi m2$ and $\phi m < \phi m3$ when a work function of the first gate electrode is $\phi m1$ a work function of the second gate electrode is $\phi m2$ and a work function of the third gate electrode is $\phi m3$ in a case where a transistor having the first to third gate electrodes is of an n-type, and a drain current of the transistor flows in a short side direction of the first gate electrode under the first gate electrode.

25. The manufacturing method of the semiconductor device according to claim 24, wherein the first gate electrode is formed of $n^+$-type polysilicon and each of the second and third gate electrodes is formed of $p^+$-type polysilicon.

26. The manufacturing method of the semiconductor device according to claim 24, wherein the first gate electrode is formed of $n^+$-type polysilicon and each of the second and third gate electrodes is formed of a refractory metal or silicide of the refractory metal.

27. The manufacturing method of the semiconductor device according to claim 26, wherein the refractory metal or silicide of the refractory metal which is the material of each of the second and third gate electrodes has substantially the same work function as that of a mid gap of silicon.

28. A manufacturing method of a semiconductor device comprising:
forming an active layer having a first side surface, a second side surface perpendicular to the first side surface and a third side surface opposite to the second side surface, and
forming a first gate electrode on the first side surface with a first gate insulating film disposed therebetween, forming a second gate electrode on the second side surface with a second gate insulating film disposed therebetween by use of a material different from that of the first gate electrode, and forming a third gate electrode on the third side surface with a third gate insulating film disposed therebetween by use of a material different from that of the first gate electrode
wherein the first to third gate electrodes are formed of materials which satisfy the relation of $\phi m1 > \phi m2$ and $\phi m1 > \phi m3$ when a work function of the first gate electrode is $\phi m1$ a work function of the second gate electrode is $\phi m2$ and a work function of the third gate electrode is $\phi m3$ in a case where a transistor having the first to third gate electrodes is of a p-type, and a drain current of the transistor flows in a short side direction of the first gate electrode under the first gate electrode.

29. The manufacturing method of the semiconductor device according to claim 28, wherein the first gate electrode is formed of $p^+$-type polysilicon and each of the second and third gate electrodes is formed of a refractory metal or silicide of the refractory metal.

30. The manufacturing method of the semiconductor device according to claim 28, wherein the first gate electrode is formed of $p^+$-type polysilicon and each of the second and third gate electrodes is formed of $n^+$-type polysilicon.

31. A manufacturing method of a semiconductor device comprising:
forming an active laye having a first side surface, a second side surface perpendicular to the first side surface and a third side surface opposite to the second side surface and
forming a first gate electrode on the first side surface with a first gate insulating film disposed therebetween, forming a second gate electrode on the second side surface with a second gate insulating film disposed therebetween by use of a material different from that of the first gate electrode, and forming a third gate electrode on the third side surface with a third gate insulating film disposed therebetween by use of a material different from that of the first gate electrode wherein the relation of φm1>φm2 and φm1>φm3 is satisfied when a work function of the first gate electrode is φm1 a work function of the second gate electrode is φm2 and a work function of the third gate electrode is φm3 in a case where a transistor having the first to third gate electrodes is of an n-type, and a drain current of the transistor flows in a short side direction of the second and third gate electrodes under the second and third gate electrodes.

32. The manufacturing method of the semiconductor device according to claim 31, wherein a material of the first gate electrode is p⁺-type polysilicon and a material of each of the second and third gate electrodes is n⁺-type polysilicon.

33. The manufacturing method of the semiconductor device according to claim 31, wherein a material of the first gate electrode is a refractory metal or silicide of the refractory metal and a material of each of the second and third gate electrodes is n⁺-type polysilicon.

34. The manufacturing method of the semiconductor device according to claim 33, wherein the refractory metal or silicide of the refractory metal which is the material of the first gate electrode has substantially the same work function as that of a mid gap of silicon.

35. A manufacturing method of a semiconductor device comprising:

forming an active layer having a first side surface, a second side surface perpendicular to the first side surface and a third side surface opposite to the second side surface, and forming a first gate electrode on the first side surface with a first gate insulating film disposed therebetween forming a second gate electrode on the second side surface with a second gate insulating film disposed therebetween by use of a material different from that of the first gate electrode and forming a third gate electrode on the third side surface with a third gate insulating film disposed therebetween by use of a material different from that of the first gate electrode wherein the relation of φm1<φm2 and φm1<φm3 is satisfied when a work function of the first gate electrode is φm1, a work function of the second gate electrode is φm2 and a work function of the third gate electrode is φm3 in a case where a transistor having the first to third gate electrodes is of a p-type, and a drain current of the transistor flows in a short side direction of the second and third gate electrodes under the second and third gate electrodes.

36. The manufacturing method of the semiconductor device according to claim 35, wherein a material of the first gate electrode is a refractory metal or silicide of the refractory metal and a material if each of the second and third gate electrodes is p⁺-type polysilicon.

37. The manufacturing method of the semiconductor device according to claim 35, wherein a material of the first gate electrode is n⁺-type polysilicon and a material of each of the second and third gate electrodes is p⁺-type polysilicon.

38. A manufacturing method of a semiconductor device comprising:

forming an active layer having a first side surface, a second side surface perpendicular to the first side surface and a third side surface opposite to the second side surface, and forming a first gate electrode on the first side surface with a first gate insulating film disposed therebetween forming a second gate electrode on the second side surface with a second gate insulating film disposed therebetween by use of a material different from that of the first gate electrode, and forming a third gate electrode on the third side surface with a third gate insulating film disposed therepetween by use of a material different from that of the first gate electrode, wherein the first to third gate electrodes are formed to make first length of the first gate electrode in the channel length direction different from second length of the second gate electrode in the channel length direction and third length of the third gate electrode in the channel length direction.

39. A manufacturing method of a semiconductor device comprising:

forming an active layer having, a first side surface, a second side surface perpendicular to the first side surface and a third side surface opposite to the second side surface, forming a first insulating film around the active layer, forming a first gate electrode on the first insulating film and first side surface with a first gate insulating film disposed therebetween, forming source and drain regions in the active layer, forming a second insulating film to cover the first gate electrode, selectively removing the first and second insulating films and first gate insulating film to form first and second grooves which expose the second and third side surfaces, and forming a second gate electrode on the second side surface in the first groove with a second gate insulating film disposed therebetween by use of a material different from that of the first gate electrode, and forming a third gate electrode on the third side surface in the second groove with a third gate insulating film disposed therebetween by use of a material different from that of the first gate electrode.

40. The manufacturing method of the semiconductor device according to claim 39, wherein the first gate insulating film and the first insulating film lying under the first gate electrode are also removed when the first and second insulating films and first gate insulating film are selectively removed.

41. The manufacturing method of the semiconductor device according to claim 39, wherein an isotropic etching process is performed after an anisotropic etching process is performed when the first and second insulating films and first gate insulating film are selectively removed.

42. The manufacturing method of the semiconductor device according to claim 39, wherein the first to third gate electrodes are formed to permit the first gate electrode to penetrate through the second and third gate electrodes.

* * * * *